(12) United States Patent
Park et al.

(10) Patent No.: US 12,218,078 B2
(45) Date of Patent: Feb. 4, 2025

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventors: Jun Hyuk Park, Icheon-si (KR); Kyung Min Park, Icheon-si (KR); Sung Gon Jin, Icheon-si (KR); Dong Won Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 379 days.

(21) Appl. No.: 17/713,869

(22) Filed: Apr. 5, 2022

(65) Prior Publication Data

US 2023/0129734 A1 Apr. 27, 2023

(30) Foreign Application Priority Data

Oct. 26, 2021 (KR) .................. 10-2021-0143985

(51) Int. Cl.
| | | |
|---|---|---|
| H01L 23/00 | (2006.01) | |
| H10B 43/27 | (2023.01) | |
| H10B 51/20 | (2023.01) | |
| H10B 61/00 | (2023.01) | |
| H10B 63/00 | (2023.01) | |

(52) U.S. Cl.
CPC ........... *H01L 23/562* (2013.01); *H10B 43/27* (2023.02); *H10B 51/20* (2023.02); *H10B 61/22* (2023.02); *H10B 63/34* (2023.02)

(58) Field of Classification Search
CPC ....... H01L 23/562; H10B 43/27; H10B 51/20; H10B 61/22; H10B 63/34; H10B 43/10; H10B 43/30; H10B 43/50
See application file for complete search history.

(56) References Cited

U.S. PATENT DOCUMENTS

| | | | |
|---|---|---|---|
| 2017/0179148 A1* | 6/2017 | Kwon | ............... H10B 43/27 |
| 2021/0066347 A1 | 3/2021 | Titus et al. | |
| 2022/0336495 A1* | 10/2022 | Jung | ............... H10B 63/845 |

FOREIGN PATENT DOCUMENTS

| | | |
|---|---|---|
| KR | 1020160138883 A | 12/2016 |
| KR | 1020170073978 A | 6/2017 |

* cited by examiner

*Primary Examiner* — Jami Valentine Miller
*Assistant Examiner* — Ashley Nicole Blackwell
(74) *Attorney, Agent, or Firm* — WILLIAM PARK & ASSOCIATES LTD.

(57) ABSTRACT

There are provided a semiconductor memory device and a manufacturing method of the semiconductor memory device. The semiconductor memory device includes: a gate stack structure including a plurality of interlayer insulating layers and a plurality of conductive patterns, which are alternately stacked in a vertical direction; a dummy stack structure including a plurality of dummy interlayer insulating layers and a plurality of sacrificial layers, which are alternately stacked in the vertical direction, the dummy stack structure being disposed at a level at which the gate stack structure is disposed; a channel structure penetrating the gate stack structure; a memory layer disposed between each of the plurality of conductive patterns and the channel structure; and a dummy pillar penetrating a portion of the dummy stack structure with a length less than a length of the channel structure in the vertical direction.

10 Claims, 21 Drawing Sheets

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2021-0143985 filed on Oct. 26, 2021, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes a plurality of memory cells capable of storing data. A three-dimensional semiconductor memory device may include a plurality of three-dimensionally arranged memory cells. Accordingly, the three-dimensional semiconductor memory device can improve the degree of integration of memory cells in a limited area, as compared with a semiconductor memory device including a plurality of two-dimensionally arranged memory cells. The number of memory cells stacked in a vertical direction may be increased to improve the degree of integration of the three-dimensional semiconductor memory device.

SUMMARY

In accordance with an embodiment of the present disclosure, there is provided a semiconductor memory device of which may include: a gate stack structure including a plurality of interlayer insulating layers and a plurality of conductive patterns, which are alternately stacked in a vertical direction; a dummy stack structure including a plurality of dummy interlayer insulating layers and a plurality of sacrificial layers, which are alternately stacked in the vertical direction, the dummy stack structure being disposed at a level at which the gate stack structure is disposed; a channel structure penetrating the gate stack structure; a memory layer disposed between each of the plurality of conductive patterns and the channel structure; and a dummy pillar penetrating a portion of the dummy stack structure, wherein a length of the dummy pillar is less than a length of the channel structure in the vertical direction.

In accordance with another embodiment of the present disclosure, there is provided a method of manufacturing a semiconductor memory device, the method may include: forming a lower stack structure including a lower scribe region and a lower chip region; forming a lower hole penetrating the lower scribe region of the lower stack structure; forming, in the lower hole, a measurement pillar including a buried layer disposed at a lower portion of the lower hole, and a reflective metal layer and an etch stop layer, which are disposed at an upper portion of the lower hole; forming an upper stack structure on the lower stack structure to cover the measurement pillar; and forming an upper hole overlapping with the measurement pillar, the upper hole penetrating the upper stack structure.

BRIEF DESCRIPTION OF THE DRAWINGS

Examples of embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first," "second," etc. may be used herein to describe various elements, these elements should not be limited by these terms. These terms are used for distinguishing one element from another element and not to suggest a number or order of elements.

An embodiment of the present disclosure may provide a semiconductor memory device and a manufacturing method of the semiconductor memory device, which can reduce a structural defect.

Figure 1:
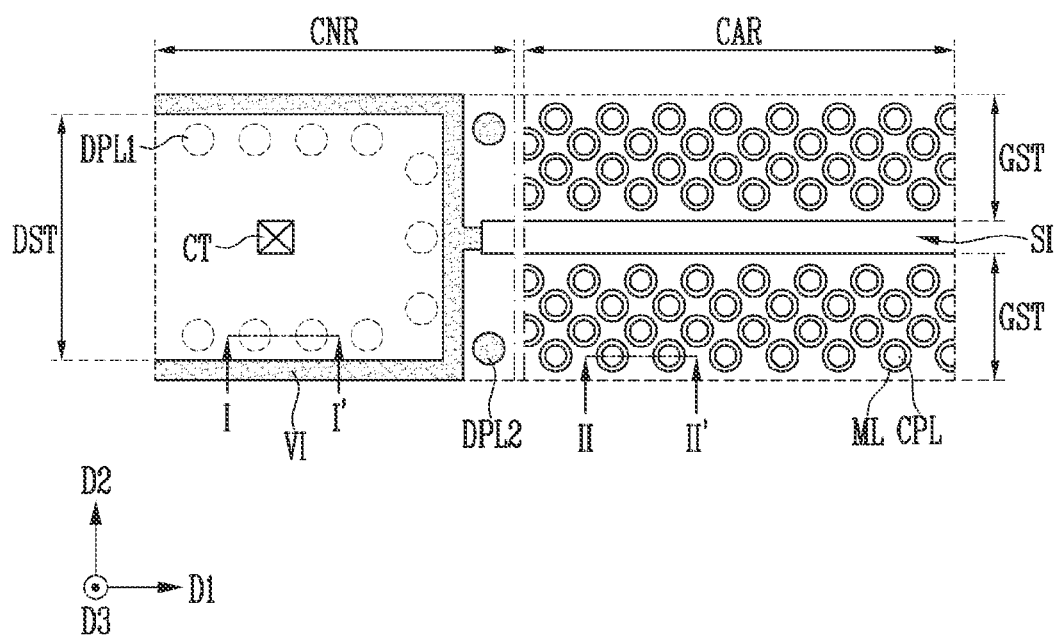
FIG. 1 is a plan view illustrating a semiconductor memory device in accordance with an embodiment of the present disclosure.

FIG. 1 is a plan view illustrating a semiconductor memory device in accordance with an embodiment of the present disclosure.

Referring to FIG. 1, the semiconductor memory device may include a cell array region CAR and a connection region CNR extending from the cell array region CAR. The semiconductor memory device may include a gate stack structure GST, a dummy stack structure DST, a plurality of first type dummy pillars DPL1 buried in the dummy stack structure DST, a conductive contact plug CT penetrating the dummy stack structure DST, a plurality of cell pillars CPL penetrating the gate stack structure GST, a memory layer ML surrounding a sidewall of each of the cell pillars CPL, a plurality of second type dummy pillars DPL2 penetrating the gate stack structure GST, and a vertical insulating layer VI between the gate stack structure GST and the dummy stack structure DST.

Each of the plurality of cell pillars CPL, the plurality of first type dummy pillars DPL1, the plurality of second type dummy pillars DPL2, and the vertical insulating layer VI may extend in a vertical direction, and the gate stack structure GST may extend in a direction intersecting the plurality of cell pillars CPL. A first direction D1, a second direction D2, and a third direction D3, which are shown in the drawing, are directions in which axes intersecting each other face. For example, the first direction D1, the second direction D2, and the third direction D3 may be respectively defined as directions in which an X axis, a Y axis, and a Z axis of an XYZ coordinate system face. The third direction D3 shown in the drawing may correspond to the above-described vertical direction.

A sidewall of the gate stack structure GST may be defined by a slit SI. The slit SI may be filled with various materials. In an embodiment, the slit SI may be filled with an insulating material. In another embodiment, the slit SI may be filled with a vertical conductive pattern and a sidewall insulating layer between the vertical conductive pattern and the gate stack structure GST. The plurality of cell pillars CPL may be disposed in the cell array region CAR, and be surrounded by the gate stack structure GST. The memory layer ML may be disposed between a cell pillar corresponding thereto and the gate stack structure GST.

The gate stack structure GST may extend to the connection region CNR from the cell array region CAR. The gate stack structure GST may have a sidewall extending along the vertical insulating layer VI in the connection region CNR.

The vertical insulating layer VI may be disposed between the gate stack structure GST and the dummy stack structure DST in the connection region CNR, and surround a sidewall of the dummy stack structure DST. The slit SI may extend to the connection region CNR from the cell array region CAR, and be adjacent to the vertical insulating layer VI.

Each of the plurality of first type dummy pillars DPL1 may be formed to have a length less than a length of each of the plurality of cell pillars CPL and the plurality of second type dummy pillars DPL2 in the third direction D3 as the vertical direction. For example, referring to FIG. 2A, the first type dummy pillar DPL1 may be formed to have the length L1 less than the length L2 of the cell pillar CPL in the third direction D3. The plurality of first type dummy pillars DPL1 may penetrate a portion of the dummy stack structure DST, and the other portion of the dummy stack structure DST may cover the plurality of first type dummy pillars DPL1. The plurality of second type dummy pillars DPL2 may be used as a support structurally supporting the gate stack structure GST.

The first type dummy pillar DPL1 and the second type dummy pillar DPL2 may be formed in different structures. In an embodiment, the second type dummy pillar DPL2 may be configured as an insulating pillar penetrating the gate stack structure GST. In another embodiment, the second type dummy pillar DPL2 may include the same material layers as the cell pillar CPL and the same material layer as the memory layer ML, and be formed in the same structure as the cell pillar CPL and the memory layer ML.

The first type dummy pillar DPL1 may include the same material layers as a measurement pillar formed in a process of manufacturing the semiconductor memory device. The first type dummy pillar DPL1 may include at least three material layers. Hereinafter, the first type dummy pillar DPL1 will be described based on various embodiments of the present disclosure.

Figure 2A:
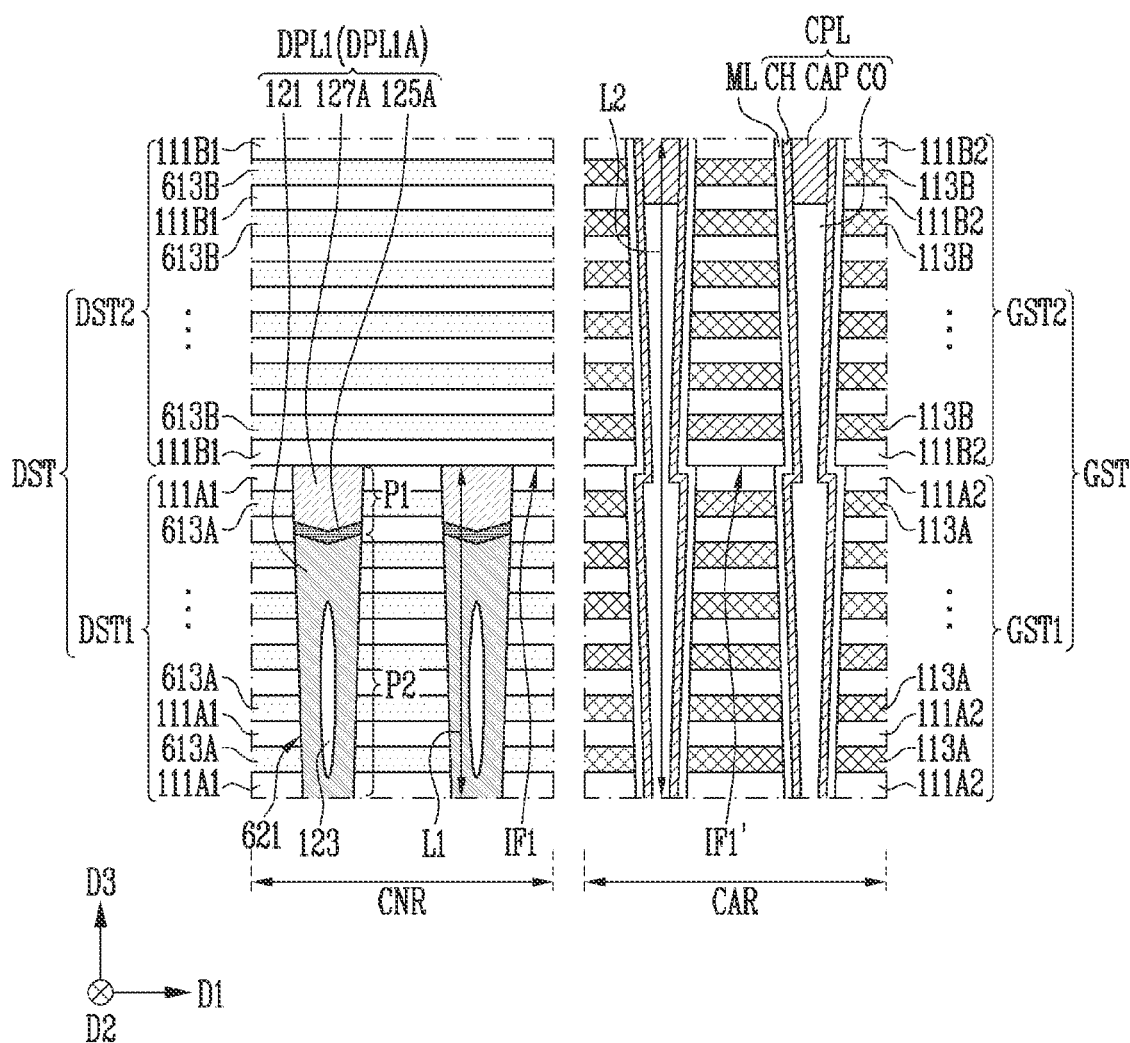
FIGS. 2A, 2B, and 2C are sectional views illustrating first type dummy pillars in accordance with various embodiments of the present disclosure.
Figure 2B:
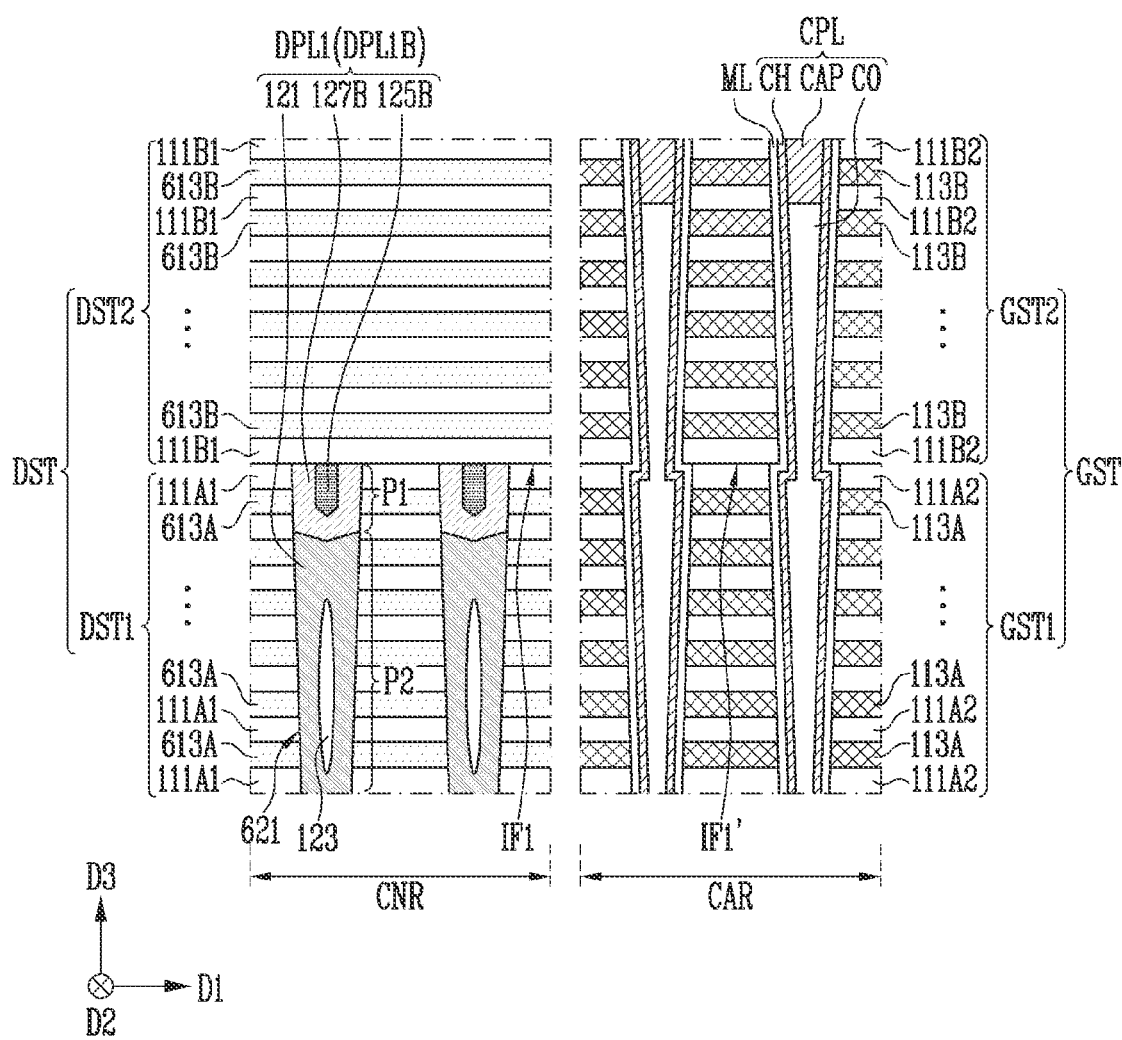
Figure 2C:
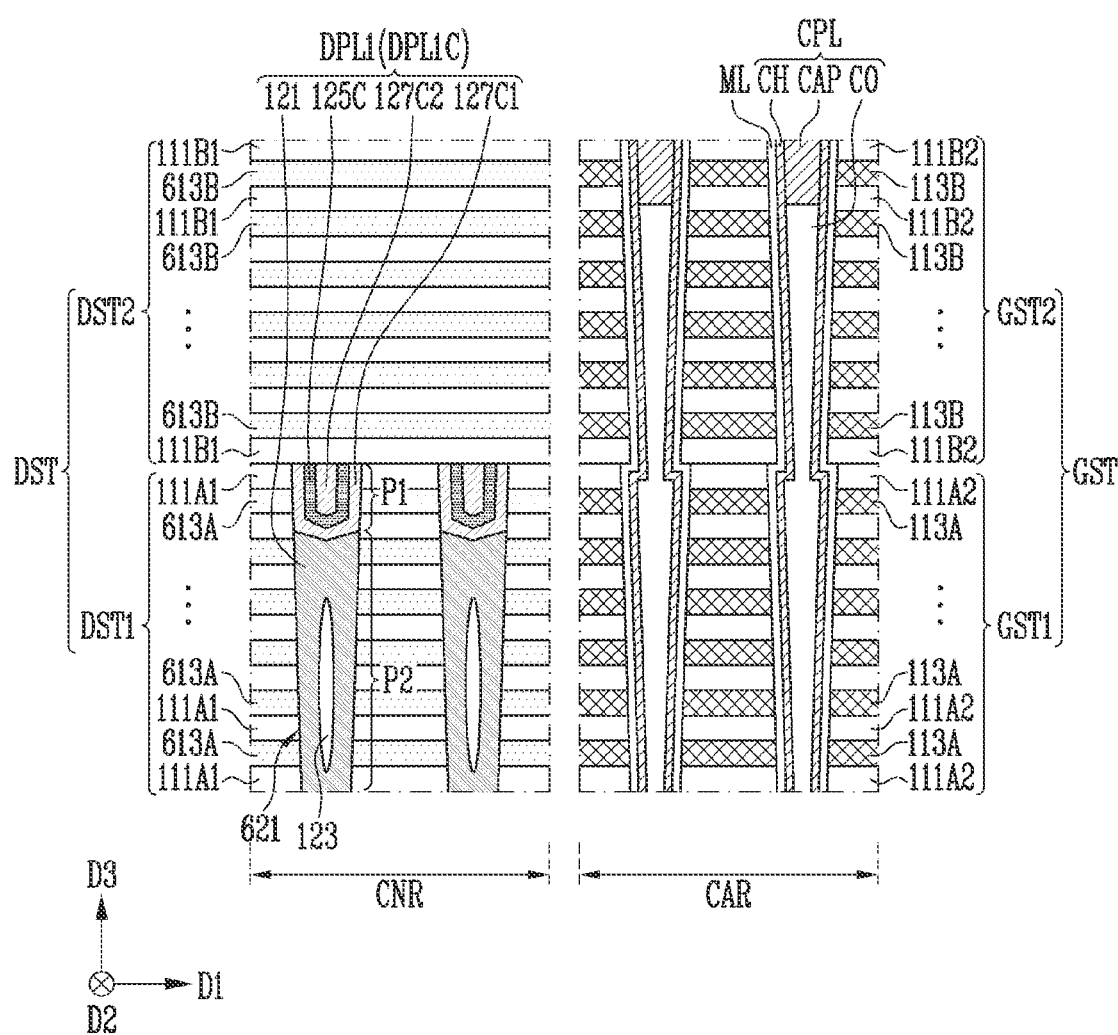

FIGS. 2A to 2C are sectional views illustrating first type dummy pillars in accordance with various embodiments of the present disclosure. Each of FIGS. 2A to 2C illustrates a section of the connection region CNR, which is taken along line I-I' of the dummy stack structure DST of the semiconductor memory device shown in FIG. 1 and a section of the cell array region CAR, which is taken along line II-II' of the gate stack structure GST of the semiconductor memory device shown in FIG. 1.

Referring to FIGS. 2A to 2C, the dummy stack structure DST may include a plurality of dummy interlayer insulating layers 111A1 and 111B1 and a plurality of sacrificial layers 613A and 613B, which are alternately stacked in the third direction D3. The plurality of sacrificial layers 613A and 613B may be formed of an insulating material different from an insulating material of the plurality of dummy interlayer insulating layers 111A1 and 111B1. In an embodiment, the plurality of dummy interlayer insulating layers 111A1 and 111B1 may be formed of silicon oxide, and the plurality of sacrificial layers 613A and 613B may be formed of silicon nitride.

The plurality of dummy interlayer insulating layers 111A1 and 111B1 and the plurality of sacrificial layers 613A and 613B may be divided into layers constituting a first type dummy stack structure DST1 and layers constituting a second type dummy stack structure DST2. The first type dummy stack structure DST1 and the second type dummy stack structure DST2 may be stacked in the third direction D3.

The plurality of dummy interlayer insulating layers 111A1 and 111B1 may include a plurality of first dummy interlayer insulating layers 111A1 and a plurality of second dummy interlayer insulating layers 111B1. The first type dummy stack structure DST1 and the second type dummy stack structure DST2 may be stacked in the third direction D3.

The plurality of sacrificial layers 613A and 613B may include a plurality of first sacrificial layers 613A and a plurality of second sacrificial layers 613B. The first type dummy stack structure DST1 may include a first dummy stack structure formed of the plurality of first dummy interlayer insulating layers 111A1 and the plurality of first sacrificial layers 613A, which are alternately disposed in the third direction D3. The second type dummy stack structure DST2 may include the plurality of second dummy interlayer insulating layers 111B1 and the plurality of second sacrificial layers 613B, which are alternately disposed in the third direction D3.

The dummy stack structure DST may be disposed at a level at which the gate stack structure GST is disposed. The gate stack structure GST may include a plurality of interlayer insulating layers 111A2 and 111B2 and a plurality of conductive patterns 113A and 113B, which are alternately stacked in the third direction D3. The plurality of interlayer insulating layers 111A2 and 111B2 and the plurality of conductive patterns 113A and 113B may be divided into layers constituting a first type gate stack structure GST1 and layers constituting a second type gate stack structure GST2. The first type gate stack structure GST1 and the second type gate stack structure GST2 may be stacked in the third direction D3.

The first type gate stack structure GST1 may be disposed at a level at which the first type dummy stack structure DST1 is disposed, and the second type gate stack structure GST2 may be disposed at a level at which the second type dummy stack structure DST2 is disposed. The plurality of interlayer insulating layers 111A2 and 111B2 may include a plurality of first interlayer insulating layers 111A2 and a plurality of second interlayer insulating layers 111B2. The plurality of conductive patterns 113A and 113B may include a plurality of first conductive patterns 113A and a plurality of second conductive patterns 113B. The plurality of first interlayer insulating layers 111A2 may be respectively disposed at levels at which the plurality of first dummy interlayer insulating layers 111A1 are disposed, the plurality of first conductive patterns 113A may be respectively disposed at levels at which the plurality of first sacrificial layers 613A are disposed, the plurality of second interlayer insulating layers 111B2 may be respectively disposed at levels at which the plurality of second dummy interlayer insulating layers 111B1 are disposed, and the plurality of second conductive patterns 113B may be respectively disposed at levels at which the plurality of second sacrificial layers 613B are disposed. The first type gate stack structure GST1 may include a first gate stack structure configured with the plurality of first interlayer insulating layers 111A2 and the plurality of first conductive patterns 113A, which are alternately stacked in the third direction D3. The second type gate stack structure GST2 may include the plurality of second interlayer insulating layers 111B2 and the plurality of second conductive patterns 113B, which are alternately stacked in the third direction D3.

The first type dummy stack structure DST1 may be penetrated by the first type dummy pillar DPL1. The second type dummy stack structure DST2 may be disposed at a level different from a level of the first type dummy pillar DPL1. The second type dummy stack structure DST2 may extend to cover the first type dummy pillar DPL1.

The cell pillar CPL may extend in the third direction D3 to penetrate the first type gate stack structure GST1 and the second type gate stack structure GST2. The memory layer ML may be disposed between each conductive pattern 113A or 113B and the cell pillar CPL. In an embodiment, the memory layer ML may extend along the sidewall of the cell pillar CPL. The cell pillar CPL may include a channel structure CH. The channel structure CH may be configured as a semiconductor layer including silicon and the like, and be used as a channel region. The channel structure CH may be formed in various structures including a cylinder shape, a tubular shape, and the like. In an embodiment, the channel structure CH may be formed in a tubular shape. The cell pillar CPL may further include a core insulating layer CO and a capping pattern CAP, which fill a central region of the tube-shaped channel structure CH. The capping pattern CAP may be formed of a semiconductor material including silicon and the like. The capping pattern CAP and a portion of the channel structure CH in contact with the capping pattern CAP may constitute a channel doping region including a conductivity type dopant. In an embodiment, the channel doping region may include an n-type impurity.

The memory layer ML may be disposed between the gate stack structure GST and the channel structure CH. The memory layer ML may include various data storage materials. The data storage materials may include a charge trap layer, a ferroelectric layer, a phase change material layer, a ferromagnetic material layer, nano dots, and the like. In an embodiment, the memory layer ML may include a tunnel insulating layer between the gate stack structure GST and the channel structure CH, a data storage layer between the tunnel insulating layer and the gate stack structure GST, and a blocking insulating layer between the data storage layer and the gate stack structure GST. The data storage layer may be formed of silicon nitride in which charges can be trapped, and the tunnel insulating layer may be formed of silicon oxide through which charges can tunnel. The blocking insulating layer may be formed of an insulating material for charge blocking. In an embodiment, the blocking insulating layer may include at least one of silicon oxide and metal oxide.

The memory layer ML and a cell pillar CPL may have an inflection point at an inter-gate first interface IF1' between the first type gate stack structure GST1 and the second type gate stack structure GST2, or have an inflection point in a region adjacent to the inter-gate first interface IF1'.

The first type dummy stack structure DST1 may be penetrated by a dummy hole group. The dummy hole group may include a dummy hole 621 penetrating the plurality of first dummy interlayer insulating layers 111A1 and the plurality of first sacrificial layer 613A of the first dummy stack structure. The dummy hole 621 may include a first part P1 adjacent to an inter-dummy first interface IF1 between the first type dummy stack structure DST1 and the second type dummy stack structure DST2 and a second part P2 extending from the first part P1 in a direction becoming distant from the inter-dummy first interface IF1. A volume of the second part P2 may be greater than a volume of the first part P1.

The first type dummy pillar DPL1 may include a first dummy pillar disposed in the dummy hole 621. The first dummy pillar may include a buried layer 121, an etch stop layer 127A, 127B or 127, and a reflective metal layer 125A, 125B or 125C.

The buried layer 121 may be disposed in the second part P2 of the dummy hole 621. The buried layer 121, which is disposed in the second part P2 having a relatively large volume as compared with the first part P1, may be formed of a material applying a relatively low stress to the gate stack structure GST as compared with the etch stop layer 127A, 127B or 127 and the reflective metal layer 125A, 125B or 125C, which are disposed in the first part P1 having a relatively small volume. In order to reduce the stress applied to the gate stack structure GST, the buried layer 121 may be formed of a material having a hardness less than hardnesses of the etch stop layer 127A, 127B or 127 and the reflective metal layer 125A, 125B or 125C. In an embodiment, the buried layer 121 may be a carbon-based material including an amorphous carbon layer, and the like. A void 123 may remain in the buried layer 121, but the embodiment of the present disclosure is not limited thereto. For example, the second part P2 of the dummy hole 621 may be filled with the buried layer 121 without the void 123.

The etch stop layer 127A, 127B or 127 may be disposed in a partial region of the first part P1 of the dummy hole 621. The etch stop layer 127A, 127B or 127 may be formed of a material selected by considering ion scattering in a dry etching process in addition to an etch selectivity in the dry etching process. In an embodiment, the etch stop layer 127A, 127B or 127 may include a titanium nitride layer (TiN). The etch selectivity and the ion scattering will be described later with reference to FIGS. 8A and 8B.

A material for the reflective metal layer 125A, 125B or 125C may be selected by considering a detection efficiency of backscattered electrodes in overlay measurement. In order to improve the detection efficiency of the backscattered electrodes, the reflective metal layer 125A, 125B or 125C may be formed of a material (high-z material) having a high atomic number as compared with the etch stop layer 127A, 127B or 127. In an embodiment, the reflective metal layer 125A, 125B or 125C may be formed of a material having an atomic number greater than 55. For example, the reflective metal layer 125A, 125B or 125C may include at least one of tantalum and tungsten.

The etch stop layer 127A, 127B or 127 and the reflective metal layer 125A, 125B or 125C may be disposed in various structures in the first part P1 of the dummy hole 621.

Referring to FIG. 2A, a reflective metal layer 125A and an etch stop layer 127A, included in a first dummy pillar DPL1A in accordance with an embodiment of the present disclosure, may be stacked in the third direction D3 on the buried layer 121. In other words, the etch stop layer 127A may be disposed closer to the inter-dummy first interface IF1 than the reflective metal layer 125A, and the reflective metal layer 125A may be disposed between the buried layer 121 and the etch stop layer 127A.

Referring to FIG. 2B, a reflective metal layer 125B included in a first dummy pillar DPL1B in accordance with an embodiment of the present disclosure may be disposed in a central region of the first part P1 of the dummy hole 621. An etch stop layer 127B included in the first dummy pillar DPL1B may extend along a sidewall of the first part P1, and surround a sidewall of the reflective metal layer 125B. The etch stop layer 127B may extend between the reflective metal layer 125B and the buried layer 121.

Referring to FIG. 2C, a first dummy pillar DPL1C in accordance with an embodiment of the present disclosure may include a reflective metal layer 125C, a liner pattern 127C1 and a core pattern 127C2. The liner pattern 127C1 and the core pattern 127C2 may be separated from each other by the reflective metal layer 125C. Each of the liner pattern 127C1 and the core pattern 127C2 may be configured as an etch stop layer 127. The liner pattern 127C1 may extend along a surface of the buried layer 121, which faces the third direction D3, and the sidewall of the first part P1 of the dummy hole 621. The core pattern 127C2 may be disposed in the central region of the first part P1. The reflective metal layer 125C may be disposed between the liner pattern 127C1 and the core pattern 127C2.

Figure 3:
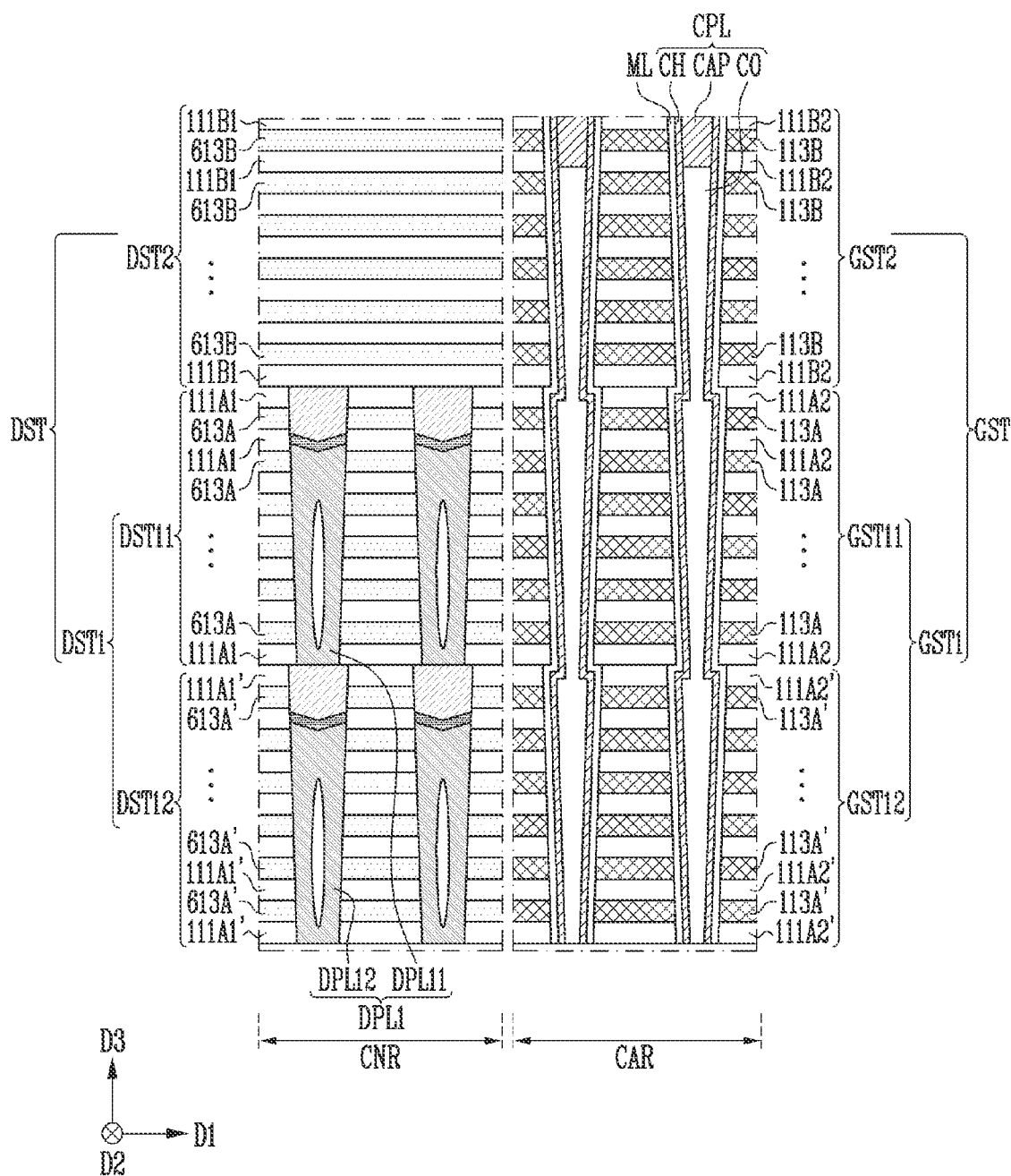
FIG. 3 is a sectional view illustrating a dummy stack structure and a gate stack structure of the semiconductor memory device in accordance with an embodiment of the present disclosure.

FIG. 3 is a sectional view illustrating a dummy stack structure and a gate stack structure of the semiconductor memory device in accordance with an embodiment of the present disclosure. FIG. 3 illustrates a section of the connection region CNR, which is taken along the line I-I' of the dummy stack structure DST of the semiconductor memory device shown in FIG. 1 and a section of the cell array region CAR, which is taken along the line II-II' of the gate stack structure GST of the semiconductor memory device shown in FIG. 1. For brevity, overlapping descriptions of components identical to the components shown in FIGS. 2A to 2C will not be discussed.

Referring to FIG. 3, the dummy stack structure DST may include a plurality of dummy interlayer insulating layers 111A1', 111A1, and 111B1 and a plurality of sacrificial layers 613A', 613A, and 613B, which are alternately stacked in the third direction D3. The dummy stack structure DST may include a first type dummy stack structure DST1 and a second type dummy stack structure DST2, which are stacked in the third direction D3. The first type dummy stack structure DST1 may include not only a first dummy stack structure DST11 in contact with the second type dummy stack structure DST2 but also at least one second dummy stack structure DST12 overlapping with the first dummy stack structure DST11 in a direction opposite to the third direction D3. Although one second dummy stack structure DST12 is exemplified in FIG. 3, the embodiment of the present disclosure is not limited thereto. In an embodiment, two or more second dummy stack structures may be stacked in the third direction D3.

The plurality of dummy interlayer insulating layers 111A1', 111A1, and 111B1 may include not only a plurality of first dummy interlayer insulating layers 111A1 of the first dummy stack structure DST11 and a plurality of second dummy interlayer insulating layers 111B1 of the second type dummy stack structure DST2, but also a plurality of lower dummy interlayer insulating layers 111A1'. The plurality of sacrificial layers 613A', 613A, and 613B may include not only a plurality of first sacrificial layers 613A of the first dummy stack structure DST11 and a plurality of second sacrificial layers 613B of the second type dummy stack structure DST2, but also a plurality of lower sacrificial layers 613A'. The plurality of lower dummy interlayer insulating layers 111A1' and the plurality of lower sacrificial layers 613A' may be alternately stacked in the third direction D3, and constitute the second dummy stack structure DST12.

The gate stack structure GST may include a plurality of interlayer insulating layers 111A2', 111A2, and 111B2 and a plurality of conductive patterns 113A', 113A, and 113B, which are alternately stacked in the third direction D3. The gate stack structure GST may include a first type gate stack structure GST1 and a second type gate stack structure GST2, which are stacked in the third direction D3. The first type gate stack structure GST1 may include not only a first gate stack structure GST11 in contact with the second type gate stack structure GST2 but also at least one second gate stack structure GST12 overlapping with the first gate stack structure GST11 in a direction opposite to the third direction D3. Although one second gate stack structure GST12 is exemplified in FIG. 3, the embodiment of the present disclosure is not limited thereto. In an embodiment, two or more second gate stack structures may be stacked in the third direction D3.

The plurality of interlayer insulating layers 111A2', 111A2, and 111B2 may include not only a plurality of first interlayer insulating layers 111A2 of the first gate stack structure GST11 and a plurality of second interlayer insulating layers 111B2 of the second type gate stack structure GST2, but also a plurality of lower interlayer insulating layers 111A2'. The plurality of conductive patterns 113A', 113A, and 113B may include not only a plurality of conductive patterns 113A of the first gate stack structure GST11 and a plurality of second conductive patterns 113B of the second type gate stack structure GST2, but also a plurality of lower conductive patterns 113A'. The plurality of lower interlayer insulating layers 111A2' and the plurality of lower conductive patterns 113A' may be alternately stacked in the third direction D3, and constitute the second gate stack structure GST12.

The second gate stack structure GST12 may be disposed at a level at which the second dummy stack structure DST12 is disposed. The plurality of lower interlayer insulating layers 111A2' may be respectively disposed at levels at which the plurality of lower dummy interlayer insulating layers 111A1' are disposed, and the plurality of lower conductive patterns 113A' may be respectively disposed at levels at which the plurality of lower sacrificial layers 613A' are disposed.

A first type dummy pillar DPL1 penetrating the first type dummy stack structure DST1 may include a first dummy pillar DPL11 penetrating the first dummy stack structure DST11 and a second dummy pillar DPL12 penetrating the second dummy stack structure DST12. The first dummy pillar DPL11 may overlap with the second dummy pillar DPL12. The first dummy pillar DPL11 may be formed of the same material layers in the same structure as one of the first dummy pillars DPL1A, DPL1B, and DPL1C described with reference to FIGS. 2A to 2C. A longitudinal sectional structure of the second dummy pillar DPL12 may be same as a longitudinal sectional structure of the first dummy pillar DPL11, and the second dummy pillar DPL12 may be formed of the same material layers as the first dummy pillar DPL11.

A cell pillar CPL may penetrate the first gate stack structure GST11 and the second gate stack structure GST12 of the first type gate stack structure GST1, and extend in the third direction D3 to penetrate the second type gate stack structure GST2. A memory layer ML may be disposed between the cell pillar CPL and each of the first gate stack structure GST11, the second gate stack structure GST12, and the second type gate stack structure GST2. The cell pillar CPL may include a channel structure CH, a core insulating layer CO, and a capping pattern CAP as described with reference to FIGS. 2A to 2C.

The memory layer ML and the cell pillar CPL may have an inflection point at interfaces among the first gate stack structure GST11, the second gate stack structure GST12, and the second type gate stack structure GST2. Alternatively, the memory layer ML and the cell pillar CPL may have an inflection point in regions adjacent to the interfaces among the first gate stack structure GST11, the second gate stack structure GST12, and the second type gate stack structure GST2.

The components described with reference to FIGS. 1, 2A to 2C, and 3 may overlap with a peripheral circuit structure. Each of the gate stack structures GST described with reference to FIGS. 1, 2A to 2C, and 3 may be disposed between a bit line and the peripheral circuit structure, or be disposed between the peripheral circuit structure and a source layer.

Figure 4:
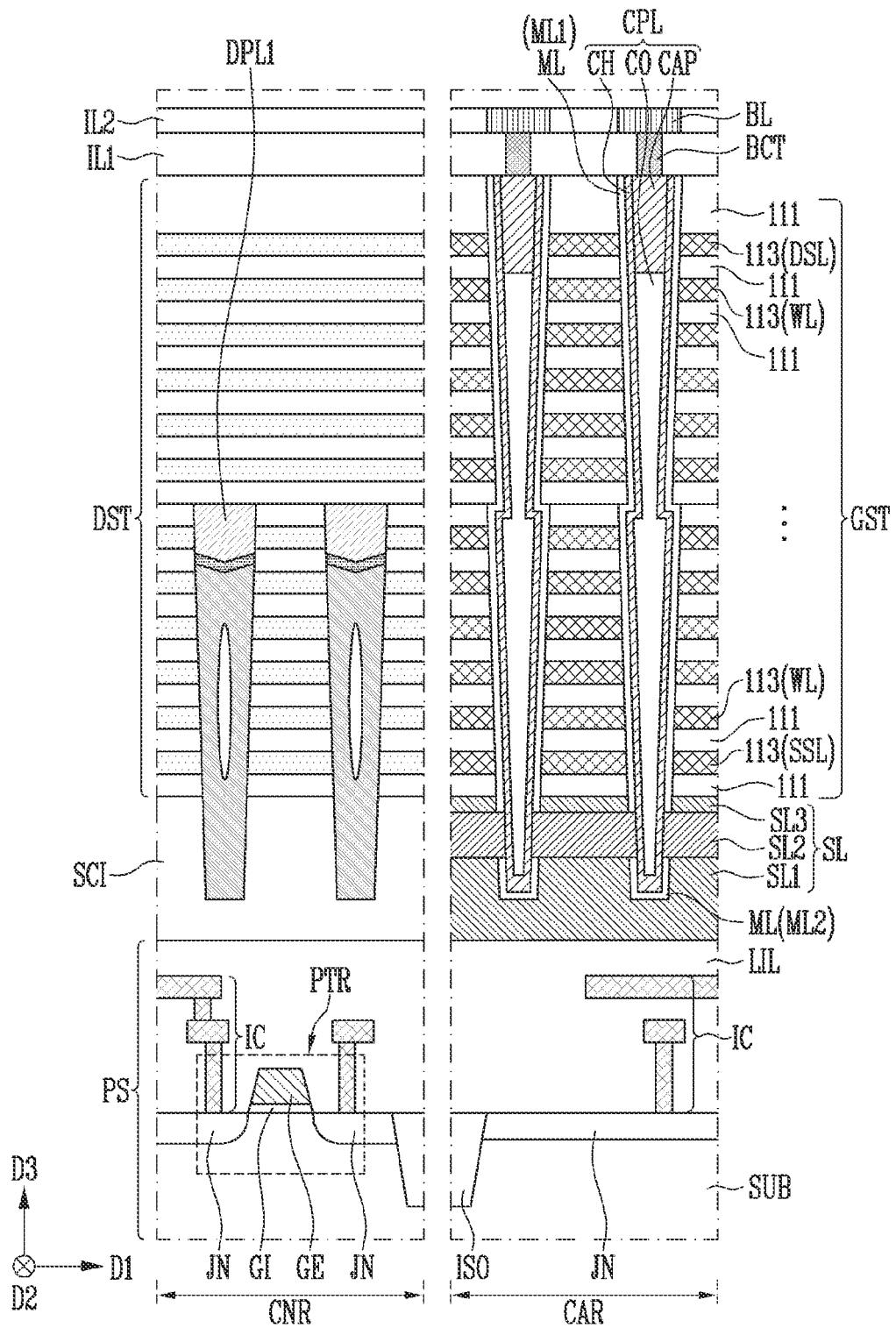
FIGS. 4 and 5 are sectional views illustrating semiconductor memory devices in accordance with embodiments of the present disclosure.
Figure 5:
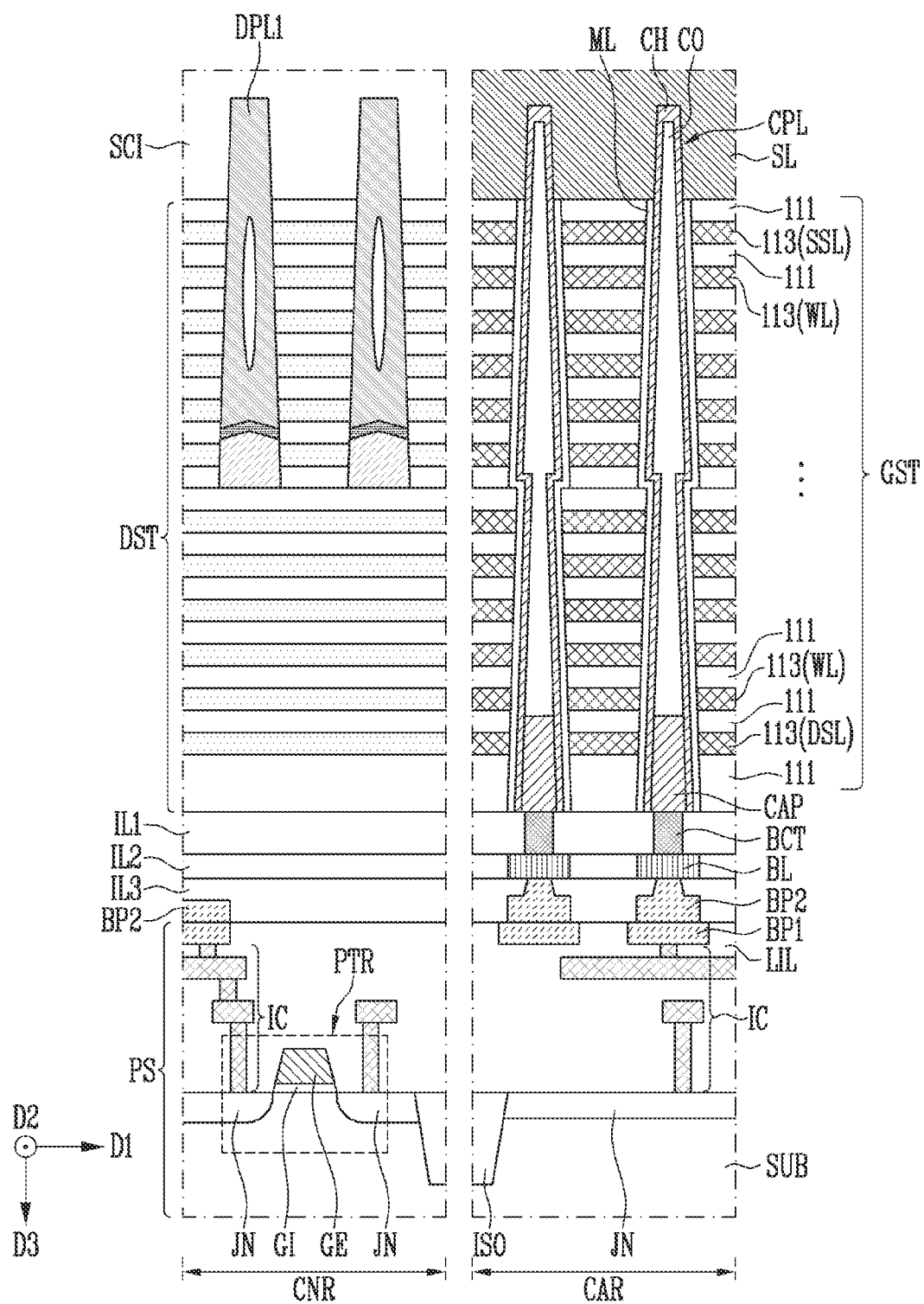

FIGS. 4 and 5 are sectional views illustrating semiconductor memory devices in accordance with embodiments of the present disclosure. Each of FIGS. 4 and 5 illustrates a section of the connection region CNR, which is taken along the line I-I' of the dummy stack structure DST of the semiconductor memory device shown in FIG. 1 and a section of the cell array region CAR, which is taken along the line II-II' of the gate stack structure GST of the semiconductor memory device shown in FIG. 1. For brevity, overlapping descriptions of components identical to the components shown in FIGS. 1 and 2A to 2C will not be discussed.

FIG. 4 illustrates an embodiment of a semiconductor memory device including a gate stack structure GST disposed between a bit line BL and a peripheral circuit structure PS. FIG. 5 illustrates an embodiment of a semiconductor memory device including the gate stack structure GST disposed between the peripheral circuit structure PS and a source layer SL.

Referring to FIGS. 4 and 5, the peripheral circuit structure PS may include a plurality of transistors PTR. Each transistor PTR may include a gate insulating layer GI, a gate electrode GE, and junctions JN. The gate insulating layer GI and the gate electrode GE may be stacked on an active region of a semiconductor substrate SUB. The active region of the semiconductor substrate SUB may be partitioned by isolation layer ISO buried in the semiconductor substrate SUB. The junctions JN may be defined as regions in which at least one of an n-type impurity and a p-type impurity is implanted into the active region of the semiconductor substrate SUB at both sides of the gate electrode GE. The junctions JN may be provided as a source region and a drain region of a transistor PTR corresponding thereto.

The plurality of transistors PTR may be connected to a plurality of interconnections IC disposed on the semiconductor substrate SUB. Each interconnection IC may include conductive patterns connected to each other, and the conductive patterns of the interconnection IC may be disposed in two or more layers.

The semiconductor substrate SUB and the plurality of transistors PTR may be covered by a lower insulating structure LIL. The plurality of interconnections IC may be buried in the lower insulating structure LIL. The lower insulating structure LIL may include two or more insulating layers.

A structure including the source layer SL, the bit line BL, and the gate stack structure GST may be disposed on the peripheral circuit structure PS. The gate stack structure GST described with reference to FIGS. 1 and 2A to 2C may be disposed between the source layer SL and the bit line BL. However, the embodiment of the present disclosure is not limited thereto. In an embodiment, the gate stack structure GST described with reference to FIG. 3 may be disposed between the source layer SL and the bit line BL.

The gate stack structure GST may include a plurality of interlayer insulating layers 111 and a plurality of conductive patterns 113, which are alternately stacked on the peripheral circuit structure PS. At least one conductive pattern adjacent to the source layer SL among the plurality of conductive patterns 113 may be used as a source select line SSL, and at least one conductive pattern adjacent to the bit line BL among the plurality of conductive patterns 113 may be used as a drain select line DSL. Although not shown in the drawings, each of two or more conductive patterns adjacent to the source layer SL among the plurality of conductive patterns 113 may be used as a source select line SSL, and each of two or more conductive patterns adjacent to the bit line BL among the plurality of conductive patterns 113 may be used as a drain select line DSL. Conductive patterns between the source select line SSL and the drain select line DSL among the plurality of conductive patterns 113 may be respectively used as a plurality of word lines WL.

The dummy stack structure DST described with reference to FIGS. 1 and 2A to 2C may be disposed at a level at which the gate stack structure GST is disposed. However, the embodiment of the present disclosure is not limited thereto. In an embodiment, the dummy stack structure DST described with reference to FIG. 3 may be disposed at the level at which the gate stack structure GST is disposed.

A source cutting insulating layer SCI may be disposed at a level at which the source layer SL is disposed. The source cutting insulating layer SCI may overlap with the dummy stack structure DST.

A process of forming the structure including the source layer SL, the bit line BL, and the gate stack structure GST may be performed on the peripheral circuit structure PS, or be provided through a process separate from the peripheral circuit structure PS.

FIG. 4 illustrates, for example, a semiconductor memory device provided by performing, on the peripheral circuit structure PS, the process of forming the structure including the source layer SL, the bit line BL, and the gate stack structure GST.

Referring to FIG. 4, the gate stack structure GST and the dummy stack structure DST may be disposed on the source layer SL. The third direction D3 may be considered as a direction facing the gate stack structure GST or the dummy stack structure DST from the peripheral circuit structure PS.

The source layer SL and the source cutting insulating layer SCI may be disposed on the lower insulating structure LIL. In an embodiment, the source layer SL may include a first source layer SL1 and a second source layer SL2, which are stacked in the third direction D3. The source layer SL may further include a third source layer SL3 on the second source layer SL2. Each of the first source layer SL1, the second source layer SL2, and the third source layer SL3 may be configured as a doped semiconductor layer including at least one of an n-type impurity and a p-type impurity. In an embodiment, each of the first source layer SL1, the second source layer SL2, and the third source layer SL3 may be formed of n-type doped silicon.

A first type dummy pillar DPL1 may include an end portion extending to the inside of the source cutting insulating layer SCI. The first type dummy pillar DPL1 may be formed in various structures as described with reference to FIGS. 2A to 2C. The first type dummy pillar DPL1 may have a first surface facing in the third direction D3 and a second surface facing the source cutting insulating layer SCI. The first surface of the first type dummy pillar DPL1 may be covered with a portion of the dummy stack structure DST.

A cell pillar CPL may include an end portion extending to the inside of the source layer SL. In an embodiment, the cell pillar CPL may penetrate the third source layer SL3 and the second source layer SL2, and extend to the inside of the first source layer SL1.

A channel structure CH and a core insulating layer CO of the cell pillar CPL may extend to the inside of the source layer SL. The core insulating layer CO of the cell pillar CPL may have a first surface facing in the third direction D3 and a second surface facing the source layer SL. A capping pattern CAP of the cell pillar CPL may be in contact with the first surface of the core insulating layer CO.

The gate stack structure GST may be covered with a first insulating layer IL1. The first insulating layer IL1 may extend to cover the dummy stack structure DST. The first insulating layer IL1 may be penetrated by a conductive bit line contact BCT. The conductive bit line contact BCT may be in contact with the capping pattern CAP of the cell pillar CPL.

The first insulating layer IL1 may be covered with the second insulating layer IL2. The second insulating layer IL2 may be penetrated by the bit line BL. The bit line BL may be in contact with the conductive bit line contact BCT.

The second source line SL2 may penetrate a memory layer ML to be in contact with a sidewall of the channel structure CH. The memory layer ML may be isolated into a first memory pattern ML1 and a second memory pattern ML2 by the second source layer SL2. The first memory pattern ML1 may be disposed between the channel structure CH and the gate stack structure GST, and extend between the channel structure CH and the third source layer SL3. The second memory pattern ML2 may be disposed between the channel structure CH and the first source layer SL1.

FIG. 5 illustrates, for example, a semiconductor memory device provided by allowing a structure including the bit line BL, the gate stack structure GST, and the like, provided through a process separate from the peripheral circuit structure PS, to be coupled to the peripheral circuit structure PS through a bonding process.

Referring to FIG. 5, the gate stack structure GST and the dummy stack structure DST, which are shown in each of FIGS. 2A to 2C and 3, may be disposed in a vertically reversed structure on the peripheral circuit structure PS. The third direction D3 may be considered as a direction facing the peripheral circuit structure PS from the gate stack structure GST or the dummy stack structure DST.

The peripheral circuit structure PS may further include a plurality of first conductive bonding patterns BP1 buried in a lower insulating structure LIL. The plurality of first conductive bonding patterns BP1 may be disposed in an uppermost layer of the peripheral circuit structure PS.

A structure including the bit line BL, the gate stack structure GST, and the dummy stack structure DST may be provided through a process separate from the peripheral circuit structure PS. The bit line BL and the gate stack structure GST may be formed to be electrically connected to a plurality of second conductive bonding patterns BP2. The bit line BL and some of the plurality of second conductive bonding patterns BP2 may be disposed between the gate stack structure GST and the peripheral circuit structure PS. Other some of the plurality of second conductive bonding patterns BP2 may be disposed between the dummy stack structure DST and the peripheral circuit structure PS.

In an embodiment, a first insulating layer IL1, a second insulating layer IL2, and a third insulating layer IL3 may be disposed between the gate stack structure GST and the peripheral circuit structure PS. The first insulating layer IL1, the second insulating layer IL2, and the third insulating layer IL3 may extend between the dummy stack structure DST and the peripheral circuit structure PS. The first insulating layer iL1 may be disposed between the second insulating layer IL2 and the gate stack structure GST, and be penetrated by a conductive bit line contact BCT. The second insulating layer IL2 may be disposed between the first insulating layer IL1 and the third insulating layer IL3, and be penetrated by the bit line BL. The third insulating layer IL3 may be disposed between the lower insulating structure LIL and the second insulating layer IL2, and be penetrated by the plurality of second conductive bonding patterns BP2.

The bit line BL may be in contact with a capping pattern of a cell pillar CPL via the conductive bit line contact BCT. Some of the plurality of second conductive bonding patterns BP2 may be connected to the bit line BL. The bit line BL may be connected to a junction JN of a semiconductor substrate SUB via the second conductive bonding pattern BP2 and the first conductive bonding pattern BP1, which are bonded to each other, and an interconnection IC.

The gate stack structure GST may include a first surface facing the peripheral circuit structure PS and a second surface facing in a direction opposite to the first surface. The source layer SL may be disposed on the second surface of the gate stack structure GST. The source layer SL may be configured as a doped semiconductor layer including at least one of an n-type impurity and a p-type impurity. In an embodiment, the source layer SL may be formed of n-type doped silicon.

A first type dummy pillar DPL1 may include an end portion extending to the inside of the source cutting insulating layer SCI. The cell pillar CPL may include an end portion extending to the inside of the source layer SL.

The first type dummy pillar DPL1 may be formed in various structures as described with reference to FIGS. 2A to 2C. The first type dummy pillar DPL1 described with reference to FIGS. 2A to 2C may overlap with the peripheral circuit structure PS in a vertically reversed structure. A portion of the dummy stack structure DST may extend between the first type dummy pillar DPL1 and the first insulating layer IL1.

A channel structure CH and a core insulating layer CO of the cell pillar CPL may extend longer toward source layer SL than a memory layer ML. In an embodiment, the channel structure CH and the core insulating layer CO may extend to the inside of the source layer SL. An end portion of the channel structure CH extending to the inside of the source layer SL may be in contact with the source layer SL.

According to the structures described above with reference to FIGS. 4 and 5, a memory cell string electrically connected between the source layer SL and the bit line BL may be defined. The memory cell string may include a source select transistor, a plurality of memory cells, and a drain select transistor, which are connected in series by the channel structure CH. The source select transistor may be defined at an intersection portion of the channel structure CH and the source select line SSL, the plurality of memory cells may be defined at intersection portions of the channel structure CH and the plurality of word lines WL, and the drain select transistor may be defined at an intersection portion of the channel structure CH and the drain select line DSL.

Hereinafter, a manufacturing method of a semiconductor memory device in accordance with an embodiment of the present disclosure will be described. Examples of processes in the following manufacturing method may be used not only to manufacture the semiconductor memory devices shown in FIGS. 1 and 2A to 2C but also to manufacture the semiconductor memory devices shown in FIGS. 3, 4, and 5.

Figure 6:
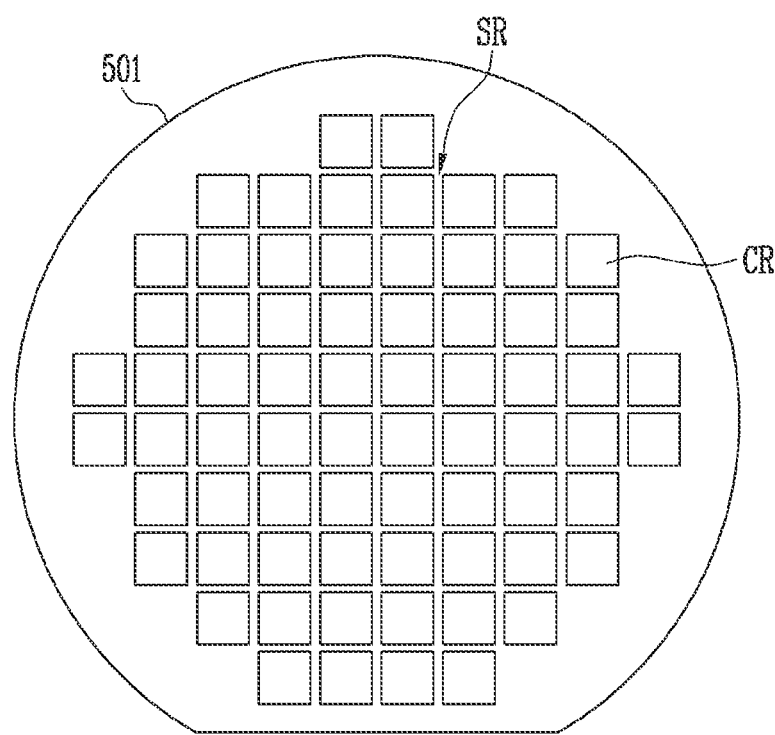
FIG. 6 is a plan view illustrating a substrate in accordance with an embodiment of the present disclosure.

FIG. 6 is a plan view illustrating a substrate in accordance with an embodiment of the present disclosure.

Referring to FIG. 6, the substrate 510 may include a scribe region SR and a plurality of chip regions CR partitioned by the scribe region SR. In an embodiment, the substrate 501 may be the substrate SUB described with reference to FIG. 4. In another embodiment, the substrate 501 may be a sacrificial substrate.

A structure for a memory cell array of a semiconductor memory device may be formed in each chip region CR.

Figure 7A:
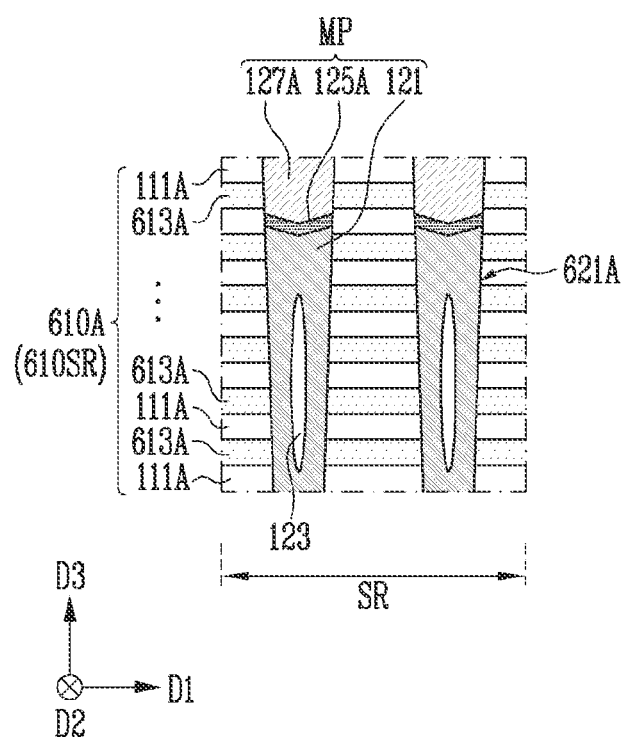
FIGS. 7A and 7B are sectional views illustrating, for example, a process of forming a lower stack structure and a process of forming a plurality of pillars.
Figure 7B:
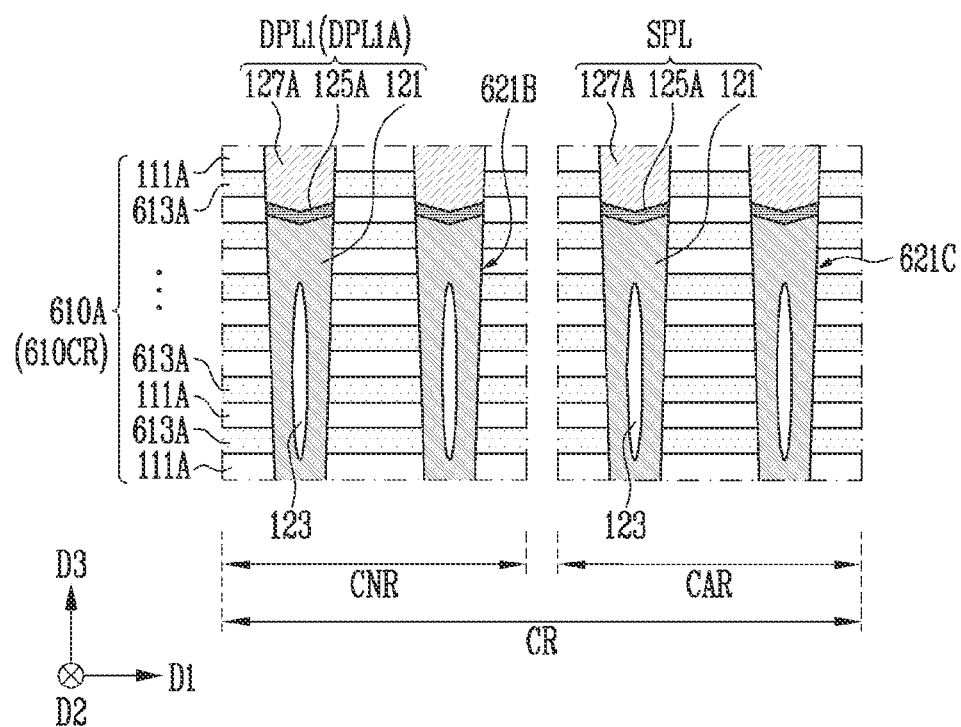

FIGS. 7A and 7B are sectional views illustrating, for example, a process of forming a lower stack structure and a process of forming a plurality of pillars. FIG. 7A illustrates a structure formed on the scribe region SR of the substrate 501 shown in FIG. 6, and FIG. 7B illustrates a structure formed on the chip region CR of the substrate 501 shown in FIG. 6.

Referring to FIGS. 7A and 7B, a lower stack structure 610A may be formed on the substrate 501 shown in FIG. 6. Although not shown in the drawings, the peripheral circuit structure PS shown in FIG. 5 may be formed in each chip region CR of the substrate 501 shown in FIG. 6, a structure for a source layer may be formed on the peripheral circuit structure PS, and then the lower stack structure 610A may be formed on the structure for the source layer. However, the embodiment of the present disclosure is not limited thereto. For example, the lower stack structure 610A may be formed on a protective layer after the protective layer is formed on the substrate 510 shown in FIG. 6, or be directly formed on the substrate 501 shown in FIG. 6.

The lower stack structure 610A may include a lower scribe region 610SR overlapping with the scribe region SR of the substrate 501 shown in FIG. 6 and a lower chip region 610CR overlapping with the chip region CR of the substrate 501 shown in FIG. 6. The lower chip region 610CR may include a cell array region CAR and a connection region CNR extending from the cell array region CAR.

The lower stack structure 610A may include a plurality of first material layers 111A and a plurality of first sacrificial layers 613A. Each of the plurality of first material layers 111A and the plurality of first sacrificial layers 613A may extend in the first direction D1 and the second direction D2. The plurality of first material layers 111A and the plurality of first sacrificial layers 613A may alternately stacked in the third direction D3. The plurality of first material layers 111A may be formed of the same material as the plurality of first dummy interlayer insulating layers 111A1 and the plurality of first interlayer insulating layers 111A2, which are described with reference to FIGS. 2A to 2C and 3. In an embodiment, the plurality of first material layers 111A may be formed of silicon oxide. The plurality of first sacrificial layers 613A may be formed of an insulating material having an etch selectivity with respect to the plurality of first material layers 111A. In an embodiment, the first sacrificial layers 613A may be formed of silicon nitride.

Subsequently, a plurality of first holes 621A, 621B, and 621C penetrating the lower stack structure 610A. The plurality of first holes 621A, 621B, and 621C may be formed through the same mask process. The plurality of first holes 621A, 621B, and 621C may include a lower hole 621A, a dummy hole 621B, and a lower channel hole 621C. The lower hole 621A may penetrate the lower scribe region 610SR of the lower stack structure 610A. The dummy hole 612B and the lower channel hole 612C may penetrate the lower chip region 160CR of the lower stack structure 610A. The dummy hole 621B may penetrate the connection region CNR of the lower chip region 610CR, and the lower channel hole 621C may penetrate the cell array region CAR of the lower chip region 610CR.

Subsequently, a plurality of pillars MP, SPL, and DPL1 may be respectively formed in the plurality of first holes 621A, 621B, and 621C. The plurality of pillars MP, SPL, and DPL1 may be formed through the same process. The plurality of pillars MP, SPL, and DPL1 may include a measurement pillar MP in the lower hole 621A, a first type dummy pillar DPL1 in the dummy hole 621A, and a sacrificial pillar SPL in the lower channel hole 621C. A first dummy pillar DPL1A of the first type dummy pillar DPL1 may be disposed in the dummy hole 621B.

The measurement pillar MP, the first dummy pillar DPL1A, and the sacrificial pillar SPL may be formed of the same material layers. To this end, the process of forming the plurality of pillars MP, SPL, and DPL1 may include a process of forming a buried layer 121 at a lower portion of each of the plurality of first holes 621A, 621B, and 621C and a process of forming a reflective metal layer (e.g., 125A) and an etch stop layer (e.g., 127A) at an upper portion of each of the plurality of first holes 621A, 621B, and 621C. The reflective metal layer and the etch stop layer may overlap with the buried layer 121. A void 123 may remain in the buried layer 121, but the embodiment of the present disclosure is not limited thereto.

The process of forming the reflective metal layer and the etch stop layer at the upper portion of each of the plurality of first holes 621A, 621B, and 621C may be performed in various manners.

In an embodiment, each of the plurality of pillars MP, SPL, and DPL1 may be formed in the same structure as the first dummy pillar DPL1A shown in FIG. 2A. The process of forming the reflective metal layer 125A and the etch stop layer 127A of each of the plurality of pillars MP, SPL, and DPL1 may include a process of forming the reflective metal layer 125A on the buried layer 121 and a process of forming the etch stop layer 127A on the reflective metal layer 125A.

In another embodiment, each of the plurality of pillars MP, SPL, and DPL1 may be formed in the same structure as the first dummy pillar DPL1B shown in FIG. 2B. Each of the plurality of pillars MP, SPL, and DPL1 may include the etch stop layer 127B and the reflective metal layer 125B, which are shown in FIG. 2B. The process of forming the etch stop layer 127B and the reflective metal layer 125B, which are shown in FIG. 2B, may include a process of forming the etch stop layer 127B extending along a surface of the buried layer 121 and an upper sidewall of each of the plurality of first holes 621A, 621B, and 621C shown in FIGS. 7A and 7B and a process of forming the reflective metal layer 125B on the etch stop layer 127B. The reflective metal layer 125B may be formed to fill a central region of the upper portion of each of the plurality of first holes 621A, 621B, and 621C shown in FIGS. 7A and 7B.

In still another embodiment, each of the plurality of pillars MP, SPL, and DPL1 may be formed in the same structure as the first dummy pillar DPL1C shown in FIG. 2C. Each of the plurality of pillars MP, SPL, and DPL1 may include the liner pattern 127C1, the reflective metal layer 125C, and the core pattern 127C2, which are shown in FIG. 2C. The process of forming the liner pattern 127C1, the reflective metal layer 125C, and the core pattern 127C2, which are shown in FIG. 2C, may include a process of forming the liner pattern 127C1 extending along a surface of the buried layer 121 and a sidewall of the upper portion of each of the plurality of first holes 621A, 621B, and 621C shown in FIGS. 7A and 7B, a process of forming the reflective metal layer 125C along a surface of the liner pattern 127C1, and a process of forming the core pattern 127C2 on the reflective metal layer 125C. The core pattern 127C2 may be formed to fill a central region of the upper portion of each of the plurality of first holes 621A, 621B, and 621C.

The material layers for the plurality of pillars MP, SPL, and DPL1 described above may be the same as the material layers for the first dummy pillar DPL1A, DPL1B or DPL1C described with reference to FIGS. 2A to 2C. For example, the buried layer 121 of each of the plurality of pillars MP, SPL, and DPL1 may be formed of a material having a hardness less than hardnesses of the reflective metal layer 125A and the etch stop layer 127A, the etch stop layer 127A of each of the plurality of pillars MP, SPL, and DPL1 may be formed of a material selected by considering etch selectivity and ion scattering in a dry etching process which will be described later, and the reflective metal layer 125A of each of the plurality of pillars MP, SPL, and DPL1 may be formed of a material having an atomic number greater than an atomic number of the etch stop layer 127A. For example, as described with reference to FIGS. 2A to 2C, the buried layer 121 may be formed of a carbon-based material, the reflective metal layer 125A may be formed of tantalum, tungsten, or the like, which has an atomic number greater than 55, and the etch stop layer 127A may be formed of a titanium nitride layer.

As described above, the plurality of pillars MP, SPL, and DPL1 having various structures are provided, so that a cross-sectional structure of the measurement pillar MP may be various in some embodiments.

Figure 8A:
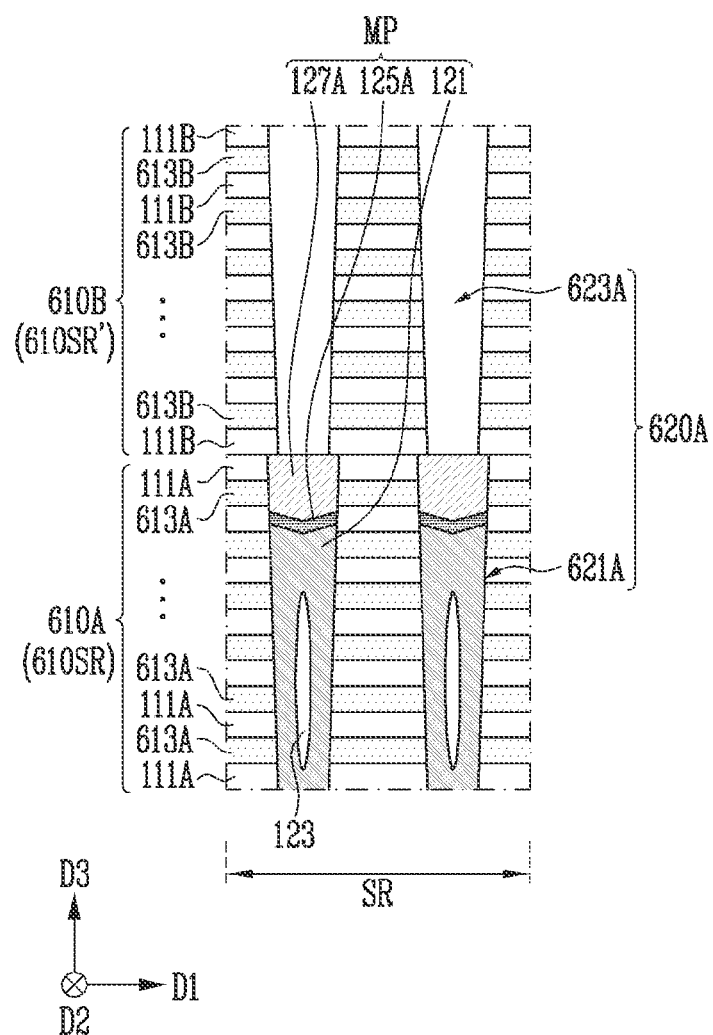
FIGS. 8A and 8B are sectional views illustrating, for example, a process of forming an upper stack structure and a process of forming a plurality of holes.
Figure 8B:
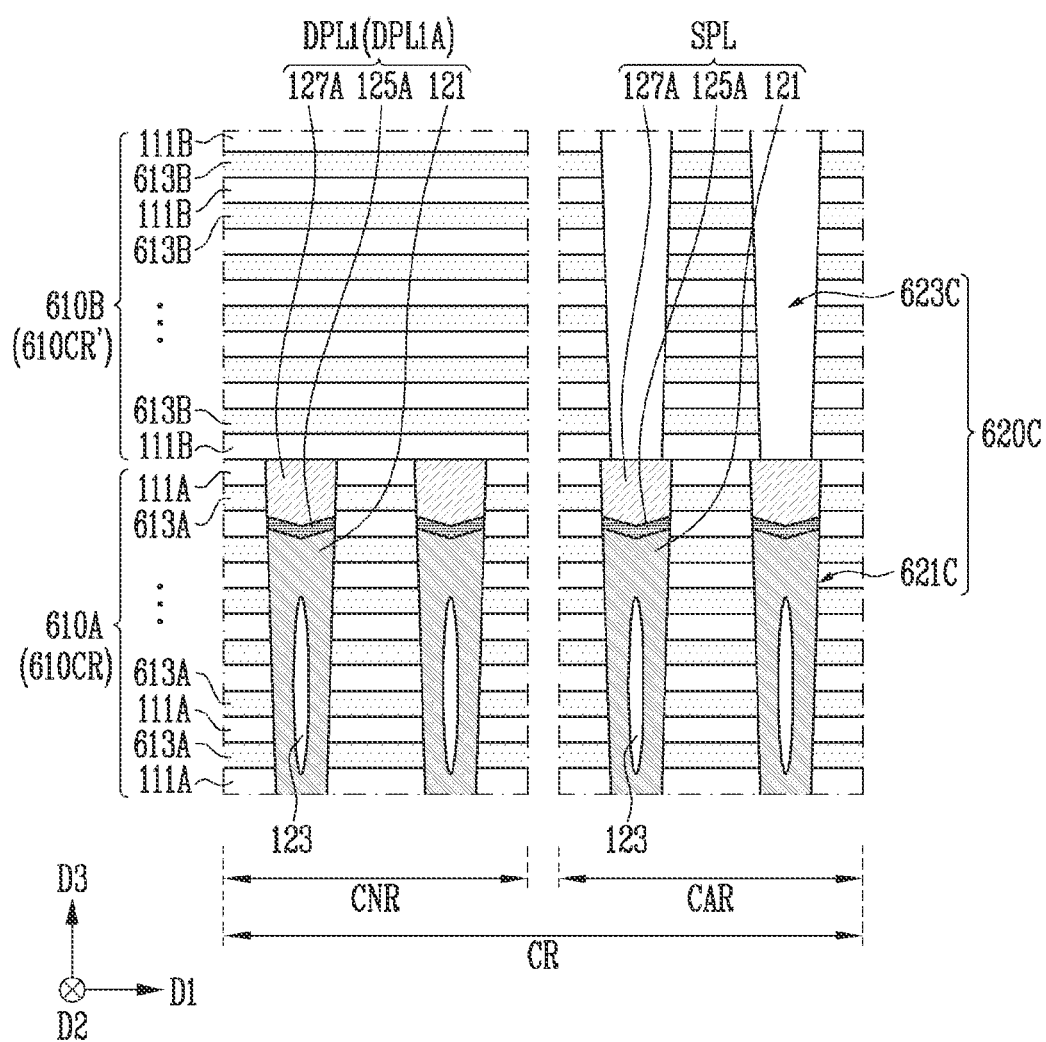

FIGS. 8A and 8B are sectional views illustrating, for example, a process of forming an upper stack structure and a process of forming a plurality of holes. FIG. 8A illustrates a structure overlapping with the lower scribe region 610SR of the lower stack structure 610A shown in FIG. 7A, and FIG. 8B illustrates a structure formed on the lower chip region 610CR of the lower stack structure 610A shown in FIG. 7B.

Referring to FIGS. 8A and 8B, an upper stack structure 610B may be formed on the lower stack structure 610A.

The upper stack structure 610B may include a plurality of second material layers 111B and a plurality of second sacrificial layers 613B. The plurality of second material layers 111B may be formed of the insulating material formed of the plurality of second dummy interlayer insulating layers 111B1 and the plurality of second interlayer insulating layers 111B2, which are described with reference to FIGS. 2A to 2C and 3. In an embodiment, the plurality of second material layers 111B may be formed of silicon oxide. The plurality of second sacrificial layers 613B may be formed of an insulating material having an etch selectivity with respect to the plurality of second material layers 111B. In an embodiment, the second sacrificial layers 613B may be formed of silicon nitride.

Each of the plurality of second material layers 111B and the plurality of second sacrificial layers 613B of the upper stack structure 610B may extend in the first direction D1 and the second direction D2 to cover the measurement pillar MP, the first dummy pillar DPL1A, and the sacrificial pillar SPL. The plurality of second material layers 111B and the plurality of second sacrificial layers 613B may be alternately stacked in the third direction D3. The upper stack structure 610B may include an upper scribe region 610SR' overlapping with the lower scribe region 610SR of the lower stack structure 610A and an upper chip region 610CR' overlapping with the lower chip region 610CR of the lower stack structure 610A.

Subsequently, a plurality of second holes 623A and 623C may be formed, which penetrate the upper stack structure 610B. The plurality of second holes 623A and 623C may be formed through the same mask process. The plurality of second holes 623A and 623C may include an upper hole 623A and an upper channel hole 623C. The upper hole 623A may overlap with the measurement pillar MP. The upper hole 623A may penetrate the upper scribe region 610SR' of the upper stack structure 610B to expose the measurement pillar MP. The upper channel hole 623C may overlap with the sacrificial pillar SPL. The upper channel hole 623C may penetrate the upper chip region 610CR' of the upper stack structure 610B to expose the sacrificial pillar SPL.

The process of the plurality of second holes 623A and 623C described above may be performed by using a dry etching process. The etch stop layer 127A may be exposed during the dry etching process. The etch stop layer 127A may be formed of a titanium nitride layer or the like, which can induce ion scattering. Accordingly, a width of a lower portion of each of the plurality of second holes 623A and 623C may be extended by the ion scattering in the etch stop layer 127A exposed through the bottom of each of the plurality of second holes 623A and 623C during the dry etching process. Because the etch stop layer 127A is formed of a titanium nitride layer or the like, which has an etch selectivity with respect to the upper stack structure 610B, the etch stop layer 127A may be used to detect an end point of the above-described dry etching process.

A process variable compensation value can be calculated by measuring an overlay, based on a center point estimated from the reflective metal layer (e.g., 125A) of the measurement pillar MP.

FIGS. 9, 10A, 10B, and 10C are views illustrating an overlay measurement method.

Figure 9:
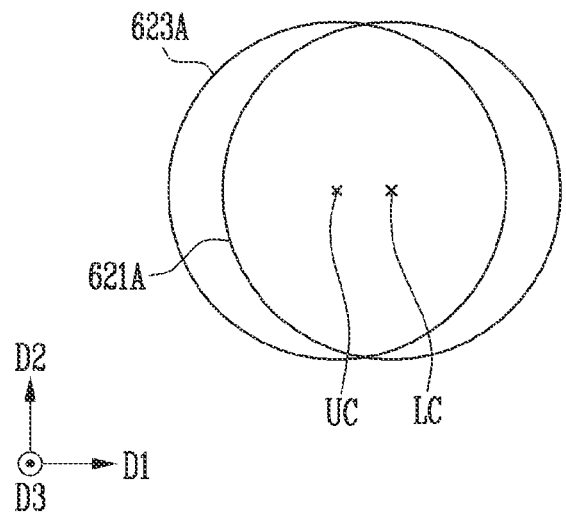
FIGS. 9, 10A, 10B, and 10C are views illustrating an overlay measurement method.

FIG. 9 is a plan view illustrating, for example, an overlay between the lower hole 621A shown in FIG. 7A and the upper hole 623A shown in FIG. 8A.

Referring to FIG. 9, an electron beam may be irradiated onto a sample including the structure shown in FIGS. 8A and 8B, and electrons radiated from the sample may be detected through a High Voltage Scanning Electron Microscope (HV-SEM), thereby acquiring an image of the lower hole 621A and an image of the upper hole 623A. A position of a center point LC of the lower hole 621A and a position of a center point UC of the upper hole 623A may be calculated based on the acquired images. An overlay between the lower hole 621A and the upper hole 623A may be measured based on the calculated position of the center point LC of the lower hole 621A and the calculated position of the center point UC of the upper hole 623A.

Based on the overlay measured in the above-described manner, it may be determined whether it is necessary to correct the process shown in FIGS. 7A and 7B and the processes described with reference to FIGS. 8A and 8B. When it is necessary to correct a process variable, a process variable correction value may be calculated based on an overlay measurement value. Subsequently, the processes described with reference to FIGS. 7A, 7B, 8A, and 8B may be corrected by reflecting the calculated correction value.

The image of the lower hole 621A may be acquired by detecting backscattered electrons radiated from the reflective metal layer (e.g., 125A) of the measurement pillar MP shown in FIG. 8A. Because a property of the etch stop layer 127A shown in FIG. 8A is to be selected by considering an ion scattering phenomenon and etch selectivity during the dry etching process, in an embodiment, there may be a limitation in improving the detection efficiency of the backscattered electrons. In order to ensure the detection efficiency of the backscattered electrons by overcoming this limitation, in an embodiment, the reflective metal layer (e.g., 125A) of the measurement pillar MP shown in FIG. 8A may be formed of a material having an atomic number greater than an atomic number of the etch stop layer 127A. For example, the reflective metal layer (e.g., 125A) of the measurement pillar MP shown in FIG. 8A may be formed of a material having an atomic number greater than 55, such as tantalum or tungsten.

Figure 10A:
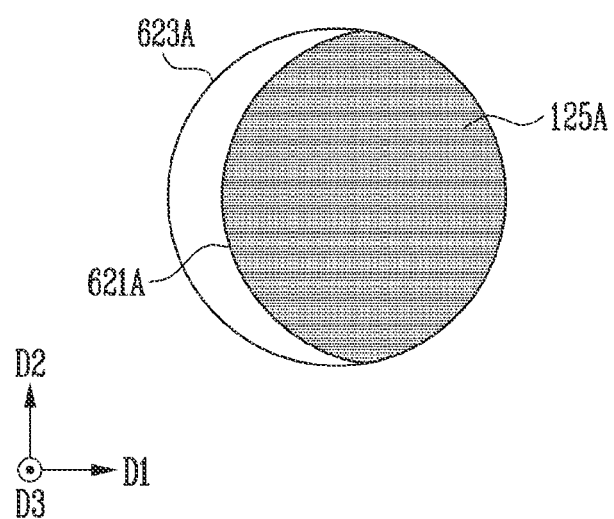
Figure 10B:
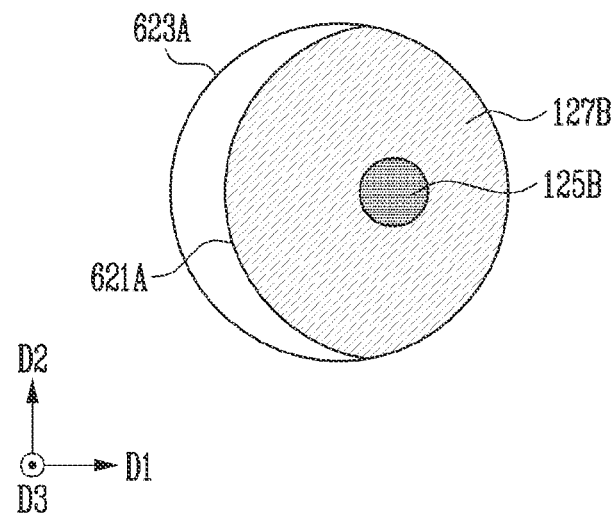
Figure 10C:
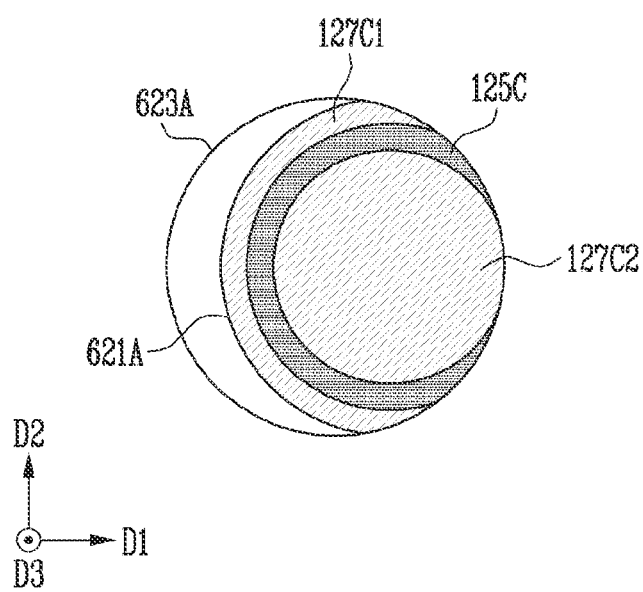

FIGS. 10A, 10B, and 10C are views illustrating a method of acquiring an image of the lower hole by using the reflective metal layer of the measurement pillar in various embodiments of the present disclosure. FIG. 10A illustrates the reflective metal layer 125A of the measurement pillar provided through the process of forming the first dummy pillar DPL1A shown in FIG. 2A. FIG. 10B illustrates the reflective metal layer 125B of the measurement pillar provided through the process of forming the first dummy pillar DPL1B shown in FIG. 2B. FIG. 10C illustrates the reflective metal layer 125C of the measurement pillar provided through the process of forming the first dummy pillar DPL1C shown in FIG. 2C.

Referring to FIG. 10A, an image measured through the reflective metal layer 125A in the lower hole 621A may correspond to a cross-sectional shape of the lower hole 621A. The reflective metal layer 125A may be blocked by the etch stop layer 127A as shown in FIGS. 2A and 8A. An acceleration voltage of an electron beam for image measurement of the lower hole 621A is controlled, so that the electron beam can be infiltrated to an arrangement depth of the reflective metal layer 125A, and thus backscattered electrons can be radiated from the reflective metal layer 125A. Accordingly, in an embodiment, a center point of the lower hole 621A can be estimated through the acquired image of the reflective metal layer 125A, and an overlay between the lower hole 621A and the upper hole 623A can be measured.

Referring to FIG. 10B, the reflective metal layer 125B in the lower hole 621A may have a structure surrounded by the etch stop layer 127B. An image measured through the reflective metal layer 125B may correspond to a central region shape of the lower hole 621A. A center point of the lower hole 621A can be estimated through the image of the reflective metal layer 125B, and an overlay between the lower hole 621A and the upper hole 623A can be measured.

Referring to FIG. 10C, the reflective metal layer 125C in the lower hole 621A may be disposed between the liner pattern 127C1 configured as an etch stop layer and the core pattern 127C2 configured as an etch stop layer, and a cross-sectional shape of the reflective metal layer 125C may have a ring type structure. In an embodiment, a center point of the lower hole 621A can be estimated through the image measured through the reflective metal layer 125C, and an overlay between the lower hole 621A and the upper hole 623A can be measured.

As described above, in an embodiment, the center point of the lower hole 621 can be estimated through the reflective metal layers 125A, 125B, and 125C having various structures. Further, in an embodiment, the accuracy of overlay measurement between the lower hole 621A and the upper hole 623A can be improved through the reflective metal layers 125A, 125B, and 125C.

Figure 11A:
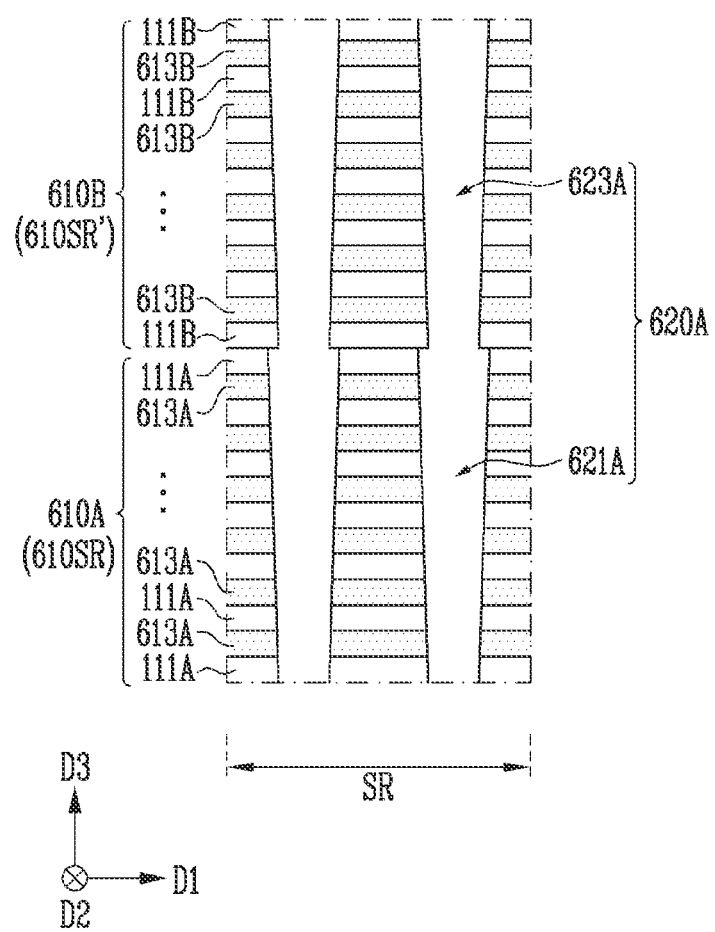
FIGS. 11A and 11B are sectional views illustrating, for example, a process of opening a channel hole.
Figure 11B:
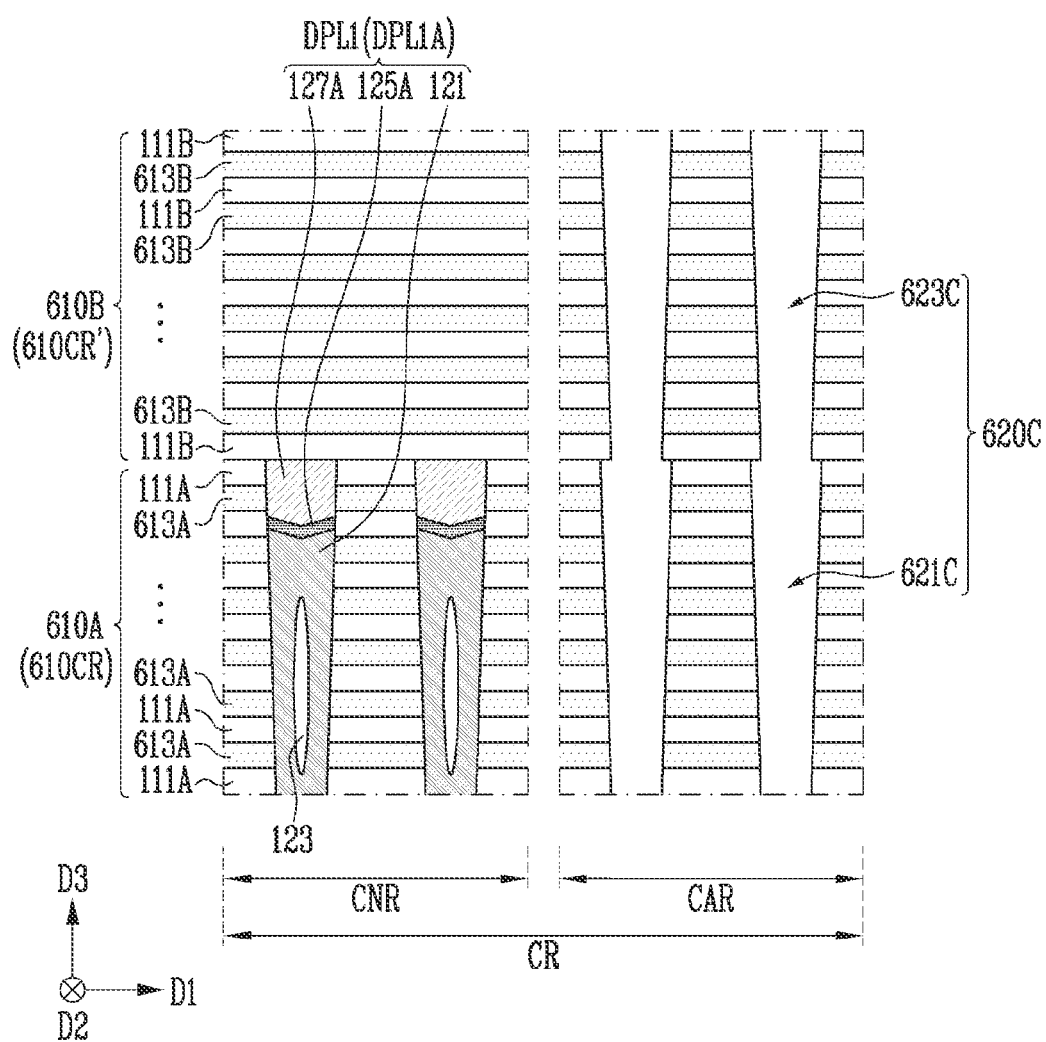

FIGS. 11A and 11B are sectional views illustrating, for example, a process of opening a channel hole. FIG. 11A illustrates a subsequent process for the lower scribe region 610SR of the lower stack structure 610A and the upper scribe region 610SR' of the upper stack structure 610B, which are shown in FIG. 8A, and FIG. 11B illustrates a subsequent process for the lower chip region 610CR of the lower stack structure 610A and the upper chip region 610CR' of the upper stack structure 610B, which are shown in FIG. 8B.

Referring to FIGS. 11A and 11B, the sacrificial pillar SPL shown in FIG. 8B may be removed through the upper channel hole 623C. Accordingly, a channel hole 620C defined by connecting the upper channel hole 623C and the lower channel hole 621C to each other may be opened.

While the sacrificial pillar SPL shown in FIG. 8B is removed, the measurement pillar MP shown in FIG. 8A may be removed through the upper hole 623A. Accordingly, a vertical hole 620A defined by connecting the upper hole 623A and the lower hole 621A to each other may be opened.

Figure 12A:
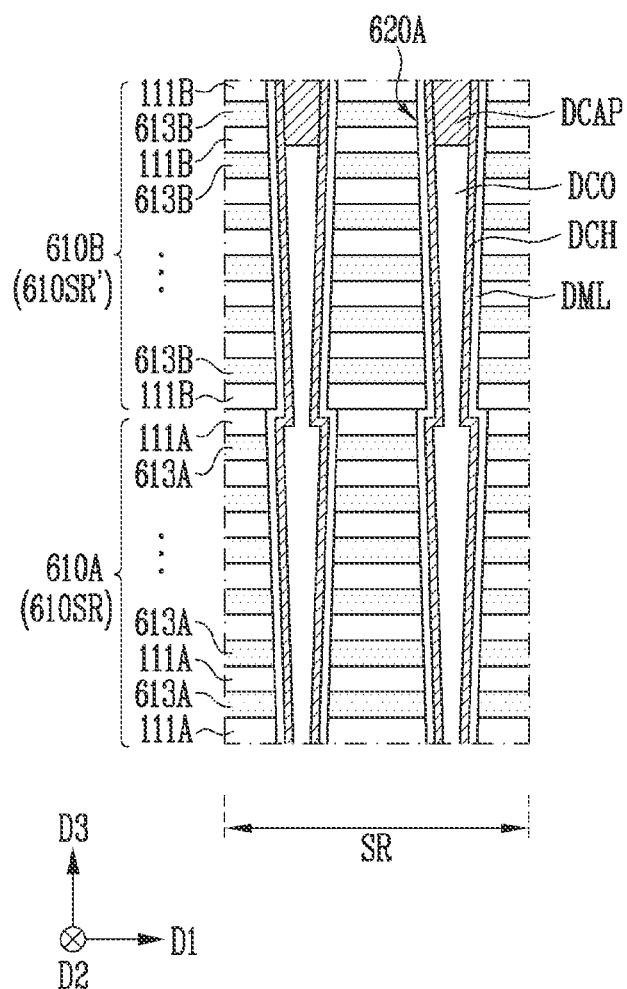
FIGS. 12A and 12B are sectional views illustrating, for example, a process of forming a memory layer and a cell pillar.
Figure 12B:
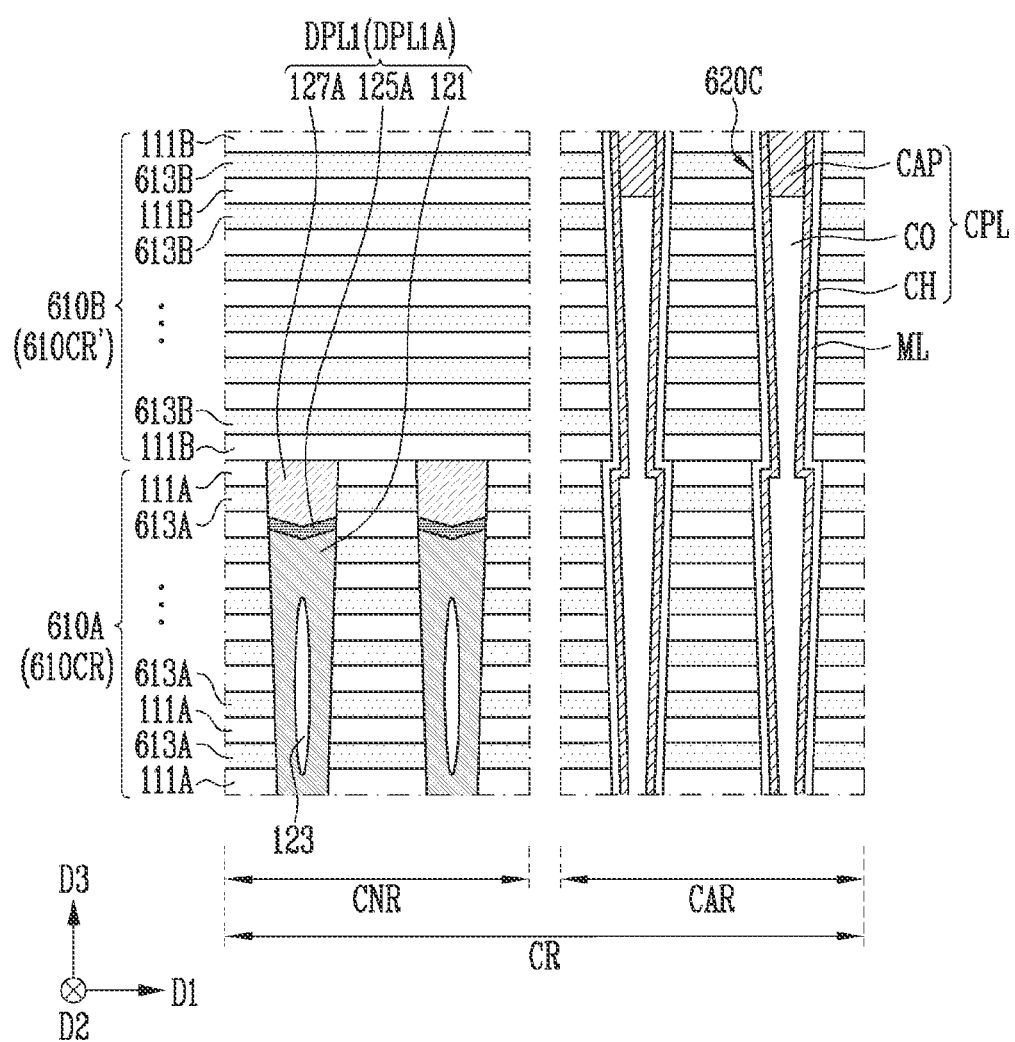

FIGS. 12A and 12B are sectional views illustrating, for example, a process of forming a memory layer and a cell pillar. FIG. 12A illustrates a subsequent process for the vertical hole 620A shown in FIG. 11A, and FIG. 12B illustrates a subsequent process for the channel hole 620C shown in FIG. 11B.

Referring to FIGS. 12A and 12B, a memory layer ML may be formed on a sidewall of the channel hole 620C. The memory layer ML may include a blocking insulating layer, a data storage layer, and a tunnel insulating layer as described with reference to FIGS. 2A to 2C. While the memory layer ML is formed, a dummy memory layer DML may be formed on a sidewall of the vertical hole 620A. The dummy memory layer DML may be formed of the same material layers as the memory layer ML.

Subsequently, a semiconductor layer for a channel structure CH may be formed on the memory layer ML. Subsequently, a core insulating layer CO and a capping pattern CAP may be formed in a central region of the channel hole 620C, which is opened by the channel structure CH. Accordingly, a cell pillar CPL may be formed, which includes the channel structure CH, the core insulating layer CO, and the capping pattern CAP. The channel structure CH of the cell pillar CPL may be formed longer in the third direction D3 than the first type dummy pillar DPL1. The capping pattern CAP may be formed of a doped semiconductor material including n-type doped silicon and the like. An impurity in the capping pattern CAP may be diffused into a partial region of the channel structure CH in contact with the capping pattern CAP.

While the channel structure CH is formed, a dummy channel structure DCH may be formed on the dummy memory layer DML. While the core insulating layer CO and the capping pattern CAP are formed, a dummy core insulating layer DCO and a dummy capping pattern DCAP may be formed in a central region of the vertical hole 620A, which is opened by the dummy channel structure DCH.

Figure 13:
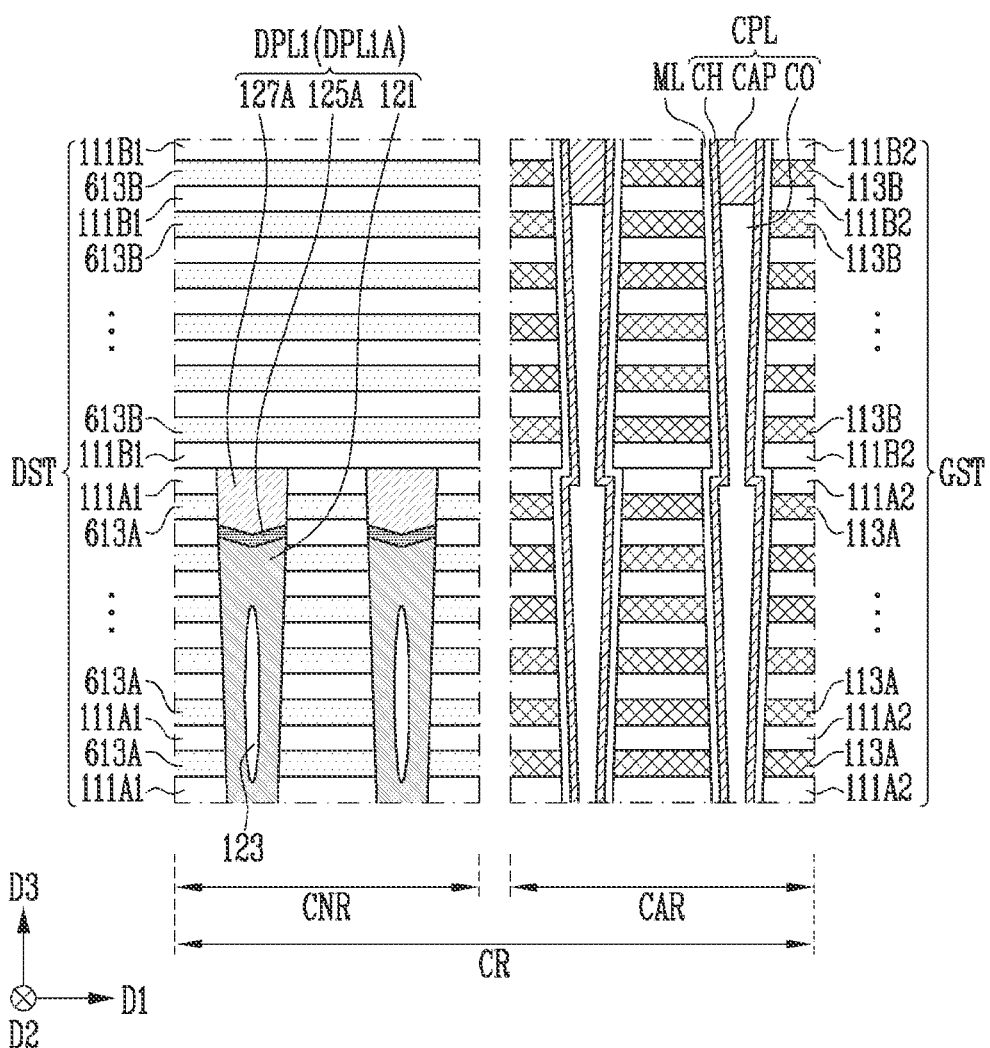
FIG. 13 is a sectional view illustrating, for example, a process of forming a plurality of conductive patterns.

FIG. 13 is a sectional view illustrating, for example, a process of forming a plurality of conductive patterns. FIG. 13 illustrates a subsequent process for the lower chip region 610CR of the lower stack structure 610A and the upper chip region 610CR' of the upper stack structure 610B, which are shown in FIG. 12B.

Referring to FIGS. 1 and 13, a vertical insulating layer VI and a plurality of second type dummy pillars DPL2 may be formed, which penetrate the connection region CNR of each of the lower chip region 610CR of the lower stack structure 610A and the upper chip region 610CR' of the upper stack structure 610B, which are shown in FIG. 12B. The vertical insulating layer VI and the plurality of second type dummy pillars DPL2 may be formed of an insulating material, and extend in the third direction D3. The plurality of first material layers 111A shown in FIG. 12B may be isolated into a plurality of dummy interlayer insulating layers 111A1 and a plurality of first interlayer insulating layers 111A2 by the vertical insulating layer VI. The plurality of second material layers 111B shown in FIG. 12B may be isolated into a plurality of second dummy interlayer insulating layers 111B1 and a plurality of second interlayer insulating layers 111B2 by the vertical insulating layer VI. The plurality of first dummy interlayer insulating layers 111A1 and the plurality of sacrificial layers 613A, which are alternately stacked in the third direction D3, and the plurality of second dummy interlayer insulating layers 111B1 and the plurality of second sacrificial layers 613B, which are alternately stacked in the third direction D3, may define a dummy stack structure DST. The dummy stack structure DST may be surrounded by the vertical insulating layer VI.

Subsequently, a slit SI may be formed, which penetrates the lower chip region 610CR of the lower stack structure 610A and the upper chip region 610CR' of the upper stack structure 610B, which are shown in FIG. 12B, in the cell array area CAR. The slit SI may extend toward the vertical insulating layer VI, and expose an end portion of the vertical insulating layer VI. The slit SI may be spaced apart from the dummy stack structure DST with the vertical insulating layer VI interposed therebetween.

Subsequently, the plurality of first sacrificial layers 613A in the lower chip region 610CR shown in FIG. 12B and the plurality of second sacrificial layers 613B in the upper chip region 610CR' shown in FIG. 12B may be removed through the slit SI. In an embodiment, while the plurality of first sacrificial layers 613A and the plurality of second sacrificial layers 613B are removed through the slit SI, the plurality of first sacrificial layers 613A and the plurality of second sacrificial layers 613B of the dummy stack structure DST may be protected by the vertical insulating layer VI. In other words, in an embodiment, the vertical insulating layer VI may serve as an etch barrier, while the plurality of first sacrificial layers 613A and the plurality of second sacrificial layers 613B are removed. In an embodiment, the plurality of first type dummy pillars DPL1 remaining in the dummy stack structure DST may assist the above-described etch barrier. For example, when the vertical insulating layer VI does not completely penetrate the plurality of first dummy interlayer insulating layers 111A1 and the plurality of first sacrificial layers 613A, the plurality of first type dummy pillars DPL1 may serve as an etch barrier blocking introduction of an etching material from the slit SI. Accordingly, in an embodiment, the stability of a manufacturing process of the semiconductor memory device may be improved through the first type dummy pillars DPL1, and a structural defect may be prevented or mitigated.

Subsequently, a plurality of first conductive patterns 113A may be formed in a region in which the plurality of first sacrificial layers 613A are etched, and a plurality of second conductive patterns 113B may be formed in a region in which the plurality of second sacrificial layers 613B are etched. Accordingly, a gate stack structure GST may be formed.

Subsequently, a process of forming a structure filling the slit SI and a process of forming a conductive contact plug CT may be performed. The scribe region SR shown in FIGS. 6 and 12A may be isolated from the chip region CR through a scribe process, after a memory cell array is manufactured.

Figure 14:
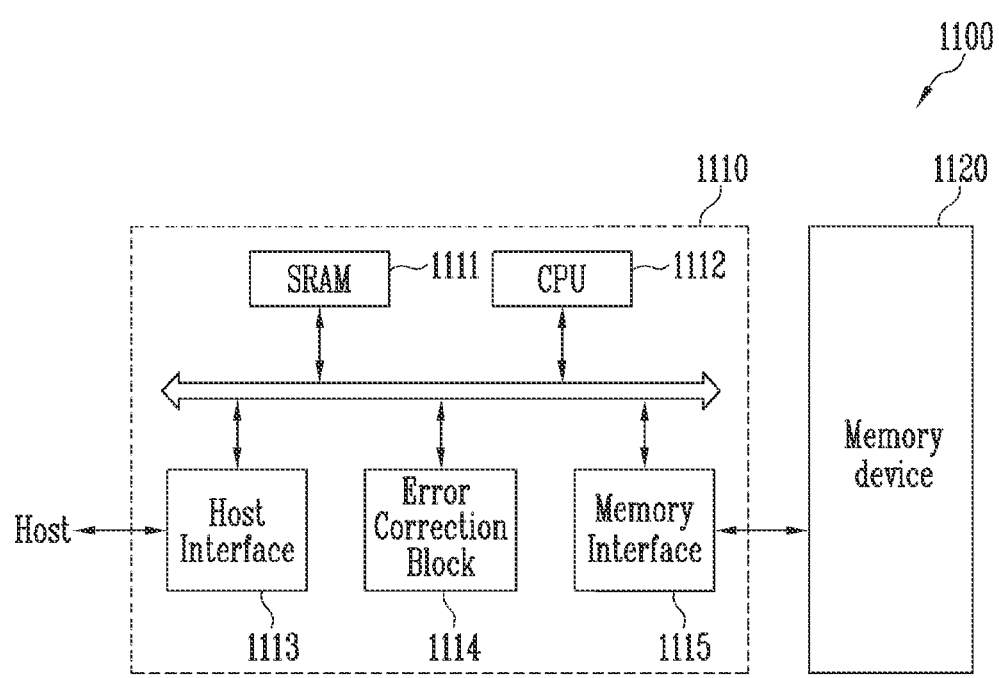
FIG. 14 is a block diagram illustrating a configuration of a memory system in accordance with an embodiment of the present disclosure.

FIG. 14 is a block diagram illustrating a configuration of a memory system in accordance with an embodiment of the present disclosure.

Referring to FIG. 14, the memory system 1100 includes a memory device 1120 and a memory controller 1110.

The memory device 1120 may include a gate stack structure, a dummy stack structure disposed at a level at which the gate stack structure is disposed, a channel structure penetrating the gate stack structure, a memory layer between the channel structure and the gate stack structure, and a dummy pillar penetrating a portion of the dummy stack structure with a length less than a length of the channel structure in a length direction of the channel structure.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 15:
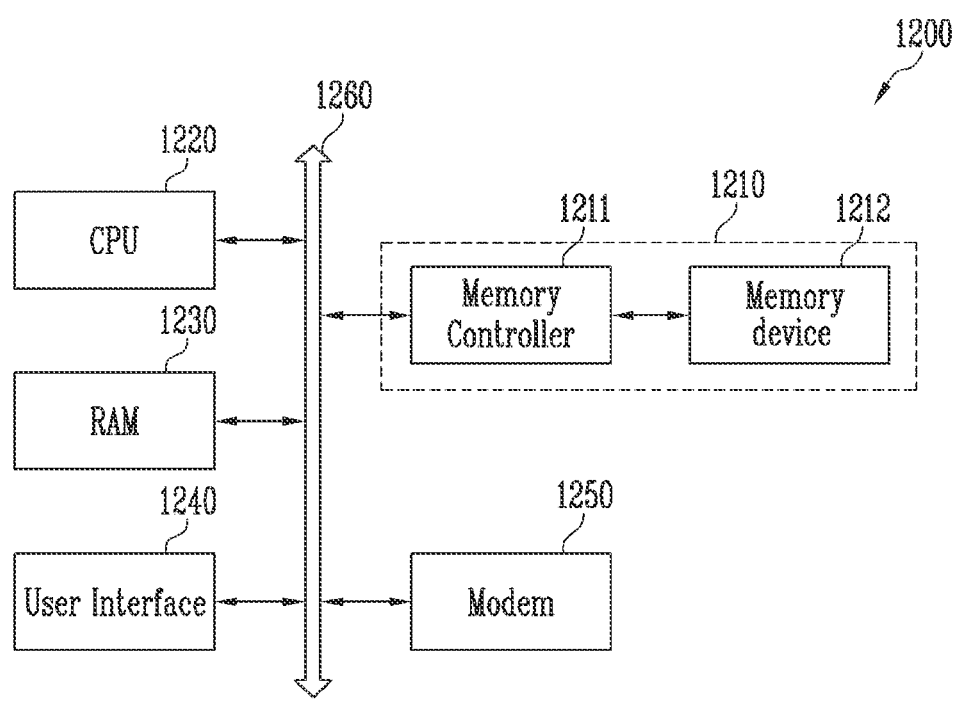
FIG. 15 is a block diagram illustrating a configuration of a computing system in accordance with an embodiment of the present disclosure.

FIG. 15 is a block diagram illustrating a configuration of a computing system in accordance with an embodiment of the present disclosure.

Referring to FIG. 15, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211.

The memory device 1212 may include a gate stack structure, a dummy stack structure disposed at a level at which the gate stack structure is disposed, a channel structure penetrating the gate stack structure, a memory layer between the channel structure and the gate stack structure, and a dummy pillar penetrating a portion of the dummy stack structure with a length less than a length of the channel structure in a length direction of the channel structure.

The memory controller 1211 may be configured identically to the memory controller 1110 described above with reference to FIG. 14.

In accordance with the present disclosure, in an embodiment, the structural stability of a gate stack structure may be improved by using a dummy pillar. In accordance with the present disclosure, in an embodiment, the stability of a manufacturing process may be improved by using a measurement pillar including a buried layer, a reflective metal layer, and an etch stop layer.

In the present disclosure, in an embodiment, a structural defect of the semiconductor memory device may be reduced through the improvement of the structural stability or the stability of the manufacturing process, which are described above.

What is claimed is:

1. A method of manufacturing a semiconductor memory device, the method comprising:
   forming a lower stack structure including a lower scribe region and a lower chip region;
   forming a lower hole penetrating the lower scribe region of the lower stack structure;
   forming, in the lower hole, a measurement pillar including a buried layer disposed at a lower portion of the lower hole, and a reflective metal layer and an etch stop layer, which are disposed at an upper portion of the lower hole;
   forming an upper stack structure on the lower stack structure to cover the measurement pillar; and
   forming an upper hole overlapping with the measurement pillar, the upper hole penetrating the upper stack structure,
   wherein a hardness of the buried layer is less than hardnesses of the reflective metal layer and the etch stop layer, and
   wherein the reflective metal layer is formed of a material having an atomic number greater than an atomic number of the etch stop layer.

2. The method of claim 1, further comprising,
   after the upper hole penetrating the upper stack structure is formed,
   measuring an overlay between the lower hole and the upper hole, based on a center point measured from the reflective metal layer of the measurement pillar.

3. The method of claim 1, wherein the lower chip region of the lower stack structure includes a cell array region and a connection region extending from the cell array region,
   wherein, while the lower hole is formed, a lower channel hole penetrating the cell array region of the lower stack structure and a dummy hole penetrating the connection region of the lower stack structure are formed,
   wherein, while the measurement pillar is formed, a sacrificial pillar disposed in the lower channel hole and a dummy pillar disposed in the dummy hole are formed, and
   wherein, while the upper hole is formed, an upper channel hole penetrating a portion of the upper stack structure overlapping with the sacrificial pillar is formed.

4. The method of claim 1, wherein the buried layer is formed of a carbon-based material.

5. The method of claim 1, wherein the reflective metal layer is formed of a material having an atomic number greater than 55.

6. The method of claim 5, wherein the reflective metal layer includes at least one of tantalum and tungsten.

7. The method of claim 1, wherein the etch stop layer includes a titanium nitride layer.

8. The method of claim 1, wherein the forming of the measurement pillar includes:
   forming the buried layer at the lower portion of the lower hole;
   forming the reflective metal layer on the buried layer; and
   forming the etch stop layer on the reflective metal layer.

9. The method of claim 1, wherein the forming of the measurement pillar includes:
   forming the buried layer at the lower portion of the lower hole;
   forming the etch stop layer extending along a surface of the buried layer and a sidewall of the upper portion of the lower hole; and
   forming the reflective metal layer on the etch stop layer to fill a central region of the upper portion of the lower hole.

10. The method of claim 1, wherein the forming of the measurement pillar includes:
    forming the buried layer at the lower portion of the lower hole;
    forming a liner pattern extending along a surface of the buried layer and a sidewall of the upper portion of the lower hole;

forming the reflective metal layer along a surface of the liner pattern; and forming a core pattern on the reflective metal layer to fill a central region of the upper portion of the lower hole, and wherein each of the liner pattern and the core pattern is the etch stop layer.

\* \* \* \* \*